United States Patent
Ohnuki et al.

(10) Patent No.: US 8,627,959 B2
(45) Date of Patent: Jan. 14, 2014

(54) SUBSTRATE STORAGE CONTAINER

(75) Inventors: Kazumasa Ohnuki, Saitama (JP); Hiroyuki Shida, Saitama (JP); Satoshi Odashima, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 229 days.

(21) Appl. No.: 12/997,414

(22) PCT Filed: Jun. 12, 2009

(86) PCT No.: PCT/JP2009/060750
§ 371 (c)(1),
(2), (4) Date: Dec. 10, 2010

(87) PCT Pub. No.: WO2009/157321
PCT Pub. Date: Dec. 30, 2009

(65) Prior Publication Data
US 2011/0100870 A1    May 5, 2011

(30) Foreign Application Priority Data

Jun. 23, 2008 (JP) ................................. 2008-162982

(51) Int. Cl.
*B65D 85/48* (2006.01)
*B65D 85/00* (2006.01)

(52) U.S. Cl.
USPC ............................. 206/711; 206/710; 206/454

(58) Field of Classification Search
USPC ................. 206/303, 455, 449, 578, 710–712, 206/722–724, 454, 832, 445; 211/41.18
See application file for complete search history.

(56) References Cited

U.S. PATENT DOCUMENTS

| 5,255,797 | A  | * | 10/1993 | Kos ............................ 211/41.18 |
| 5,749,469 | A  |   | 5/1998  | Williams |
| 6,874,638 | B2 | * | 4/2005  | Iijima et al. .................... 206/711 |
| 7,357,257 | B2 | * | 4/2008  | Matsutori et al. ............. 206/710 |
| 7,549,552 | B2 | * | 6/2009  | Hasegawa et al. ............ 220/323 |
| 7,900,776 | B2 | * | 3/2011  | Burns et al. .................... 206/711 |

FOREIGN PATENT DOCUMENTS

| JP | 2000-306988 A | 11/2000 |
| JP | 2002-68364 A  | 3/2002 |
| JP | 2003-174080 A | 6/2003 |

(Continued)

OTHER PUBLICATIONS

International Search Report issued in PCT/JP2009/060750, mailed on Aug. 18, 2009, 1 page.

(Continued)

*Primary Examiner* — Mickey Yu
*Assistant Examiner* — Chun Cheung
(74) *Attorney, Agent, or Firm* — Osha Liang LLP

(57) ABSTRACT

A separate supporting body for supporting semiconductor wafers of φ450 mm is attached to the inner surface of either sidewall of a container body. Each supporting body is formed of a front supporting piece that is projected laterally from a frame and horizontally retains the wafer on, at least, the side part in the front peripheral edge; and a rear supporting piece that is projected laterally from frame and horizontally retains the wafer on, at least, the side part in the rear peripheral edge. Front supporting piece is formed of a projected part that extends from the front of frame toward the front peripheral edge of the semiconductor wafer and a curved part that extends rearwards from projected part along the peripheral edge of the semiconductor wafer.

10 Claims, 25 Drawing Sheets

(56) References Cited

FOREIGN PATENT DOCUMENTS

| | | |
|---|---|---|
| JP | 2004-214269 A | 7/2004 |
| JP | 2006-128461 A | 5/2006 |
| JP | 2008-118000 A | 5/2008 |
| JP | 2008-140948 A | 6/2008 |
| WO | 99/39994 A1 | 8/1999 |
| WO | 2008/065892 A1 | 6/2008 |

OTHER PUBLICATIONS

English translation of the International Preliminary Report on Patentability and Written Opinion of The International Searching Authority mailed on Feb. 17, 2011, 6 pages.

Extended European Search Report for Application No. 09770031.4, mailed on May 16, 2012 (6 pages).

Japanese Notification of Reasons for Refusal issued in JP Application No. 2010-517892, dated Dec. 11, 2012 (4 pages).

* cited by examiner

SUBSTRATE STORAGE CONTAINER

TECHNICAL FIELD

The present invention relates to a supporting body and a substrate storage container for supporting wafers such as semiconductor wafers etc.

BACKGROUND ART

Though not illustrated, a conventional substrate storage container for accommodating semiconductor wafers comprises a front open box container body for accommodating a plurality of thin semiconductor wafers of ϕ300 mm in alignment and a door that is detachably attached to open and close the open front of this container body. The container body is injection-molded using molding material including resin, on the assumption that semiconductor wafers having a thickness of 700 to 800 μm are accommodated. Provided on the inner surface of both side-walls are plural pairs of left and right teeth, each integrally formed for horizontally supporting a semiconductor wafer and arranged vertically with a predetermined pitch (see Patent Documents 1, 2, 3, 4, 5 and 6).

Each pair of teeth are horizontally projected inwards from the inner surface of the side-walls of the container body so that each forms an elongate plate piece extending from the front to rear of the container body with its rear part gradually narrowed as it goes to the rear of the container body, and function to support a semiconductor wafer from the bottom at around the areas of the peripheral edge thereof, located across the maximum diameter from one side to the other. The semiconductor wafer thus supported by these teeth is put in and taken out by a dedicated robot.

However, recently, in order to improve productivity and enlarge the chip size in conformity with enlargement of memory capacity, ϕ450 mm semiconductor wafers have been studied and internationally discussed as a next generation type after the ϕ300 mm type. With increased discussion of this, substrate storage containers configured to support the large-diametric semiconductor wafers have become demanded.

PRIOR ART DOCUMENTS

Patent Documents
Patent Document 1: WO99/39994
Patent Document 2:
Japanese Patent Application Laid-open No. 2000-306988
Patent Document 3:
Japanese Patent Application Laid-open No. 2004-214269
Patent Document 4:
Japanese Patent Application Laid-open No. 2006-128461
Patent Document 5:
Japanese Patent Application Laid-open No. 2002-68364
Patent Document 6:
Japanese Patent Application Laid-open No. 2003-174080

SUMMARY OF THE INVENTION

Since the conventional substrate storage container is thus configured and formed on the assumption that the container body and teeth supports and accommodates ϕ300 mm semiconductor wafers of 700 to 800 μm thick, if semiconductor wafers of ϕ300 mm being formed with a thickness of 600 μm or thinner, or thin and heavier large-diametric semiconductor wafers of ϕ450 mm are supported, the amount of sag of the semiconductor wafer will increase.

As a result, there is a fear of wafer breakage due to vibration of semiconductor wafers, contact between adjacent semiconductor wafers and resonance during transportation. Further, if the amount of sag of semiconductor wafers increases, there also occurs a fear that semiconductor wafers cannot be put in and taken out in safety when the wafers are put in and taken out by a dedicated robot.

One or more embodiments of the present invention provide a supporting body and a substrate storage container that can prevent thin wafers and large-diametric wafers from being damaged due to vibration, contact and the like, and enables these wafers to be put in and taken out in safety.

In one or more embodiments, a supporting body of the present invention includes a frame with supporting members for supporting wafers having a diameter of 300 mm or greater, and is characterized in that the supporting member includes: a front supporting piece that is projected from the frame and approximately horizontally retains a wafer on, at least, the side part in the front peripheral edge; and a rear supporting piece that is projected from the frame and approximately horizontally retains the wafer on, at least, the side part in the rear peripheral edge, and the front supporting piece is formed of a projected part that extends from the front of the frame toward the front peripheral edge of the wafer and a curved part that extends rearwards from the projected part along the peripheral edge of the wafer.

Here, the frame, the front supporting piece and the rear supporting piece may be integrally molded with a hollow formed between the frame and the front supporting piece.

The frame may include a left-and-right direction positioning attachment portion for positioning with respect to the left and right direction; and a vertical direction positioning attachment for positioning with respect to the vertical direction.

The frame may include a height adjustor for adjusting the height.

The frame may be given in an approximately laterally long form having a sectioning joint piece between the opposing top and bottom parts, and the rear of the curved part of the front supporting piece and the front end of the rear supporting piece may be joined to the sectioning joint piece.

Further, the frame may be formed with an attachment portion, and a height adjustor may be formed at least one of the upper and lower parts of the frame.

Supporting projections for horizontally supporting the wafer may be formed in both the front supporting piece and the rear supporting piece.

A reinforcing joint piece for supporting the rear supporting piece may be provided between the top and bottom parts of the frame.

Further, it is possible that attachment pins are projectively formed in the front-most part of the crossrails of the frame while positioning attachment pieces are projectively formed in the rear of the attachment pins, in the front part of the crossrails and that the stile in the front part of the frame is formed with a cutout groove while the stile in the rear of the frame is formed with an expanded attachment piece.

Of the backside and crossrails of the frame that oppose the inner side of the container body, at least the backside may be covered by a covering plate, and this covering plate may be formed with a plurality of positioning bosses while hooks may be formed between the multiple positioning bosses and a plurality of positioning ribs may be provided for the covering plate.

Further, in one or more embodiments, the present invention is characterized in that a substrate storage container includes supporting bodies as described above attached to both the interior side walls of a container body for accommodating wafers having a diameter of 300 mm or greater.

Here, the container body may be formed of a front open box with a front opening, a pair of supporting structures for supporting bodies may be provided on both the interior side walls of the container body, and the supporting structure may include: a pair of top and bottom supporting rails that abut the vertical direction positioning attachment portion of the supporting body to position the supporting body with respect to the height direction and an attachment portion for positioning the supporting body with respect to the left-and-right direction.

Also, separate supporting structures may be attached afterwards to both the interior side walls of the container body.

The supporting structures may be integrally formed on both the interior side walls of the container body.

Further, the supporting rail of the supporting structure may be formed with a cutout that fits with the positioning rib formed on the supporting body and an engagement claw that engages an engagement hook formed in the supporting body.

At least one falling stopper for the supporting body may be formed inside the container body.

Moreover, the container body may be formed as a front open box having an opening in the front. Left-and-right attachment grooves for the supporting bodies may be formed on the front side at the top and bottom inside the container body. A plurality of fall stoppers for positioning and holding the expanded attachment pieces of the supporting bodies may be disposed on the rear side inside the container body. Pairs of fitting rails for the positioning attachment pieces of the supporting bodies may be formed opposing each other at the top and bottom on both the interior side walls of the container body while key-equipped stoppers for attachment grooves of supporting bodies, located on the front side may be formed in the interior side walls of the container body.

Further, the container body may be formed as a front open box having an opening in the front. A separate supporting structure for supporting the supporting body may be provided on each interior side wall of the container body. Each supporting structure may include a plurality of supporting rails that are spaced opposing each other and extended in the front-to-rear direction of the container body and a joint plate that joins the rear ends of the plural supporting rails. The supporting rail of the supporting structure may be formed of a flat plate that extends in the front-to-rear direction of the container body and a plurality of parallel ribs that are formed opposing each other on the inner surface of the flat plate and hold the positioning bosses of the covering plate of the supporting body. The plural parallel ribs may be formed with cutouts that fit the positioning ribs of the covering plate of the supporting body. Of the multiple parallel ribs, the rib located above may be formed with engagement claws that engages the hooks of the covering plate of the supporting body while an operational through-hole for releasing the engagement between the supporting body and the engagement claws may be provided.

Here, the wafers in the scope of the claims may include semiconductor wafers of ϕ300 mm or greater and various kinds of wafers that are thin and likely to sag. Further, the rear part of the frame and the rear supporting piece can be curved along the side part in the rear peripheral edge. The numbers of the front retraining piece and the rear supporting piece may be singular or plural, or increased or decreased, as required. Moreover, the container body may be either, transparent, translucent or opaque, and will not be particularly limited.

According to one or more embodiments of the present invention, the front supporting pieces and rear supporting pieces of the supporting members projected from the frames support the underside of the wafer, at not only the vicinity of the maximum diameter of the peripheral edge of the wafer but in greater areas on both sides than the conventional configuration does.

One or more embodiments present invention are effective in preventing thin wafers and large-diametric wafers from being damaged due to vibration and contact. Further, one or more embodiments of the invention are effective in enabling these wafers to be put in and taken out in safety.

Further, when the frame, the front supporting piece and the rear supporting piece are formed integrally, creating a hollow between the frame and the front supporting piece, it is possible to inhibit generation of sink marks on the surface, or deformation, of the front supporting piece during molding and hence improve dimensional accuracy even if, for example the proximal part of the front supporting piece is formed thick while the projected part and curved part of the front supporting piece are made long.

When the frame is given in approximately laterally long form having a sectioning joint piece between the opposing top and bottom parts, and the rear of the curved part of the front supporting piece and the front end of the rear supporting piece are joined to the sectioning joint piece, it is possible to divide the long supporting member into the front and rear parts and join the ends to the sectioning joint piece, it is hence possible to prevent deformation of the supporting members during molding.

Further, when a reinforcing joint piece for supporting the rear supporting piece is provided between the top and bottom parts of the frame, it is possible to prevent hindrance to wafer's positioning accuracy and the like due to sag of the rear supporting pieces depending on the weight and the number of wafers.

DETAILED DESCRIPTION

Now, embodiments of a substrate storage container according to the present invention will be described with reference to the drawings. The substrate storage container in accordance with one or more embodiments includes, as shown in FIGS. 1 through 24, a container body 1 of a front open box for accommodating a plurality of large-diametric semiconductor wafers W and a door 60 that opens and closes an open front 31 of this container body 1. A separate supporting body 40 that can horizontally support large-diametric semiconductor wafers W is attached on either side in the interior of container body 1.

Figure 1:
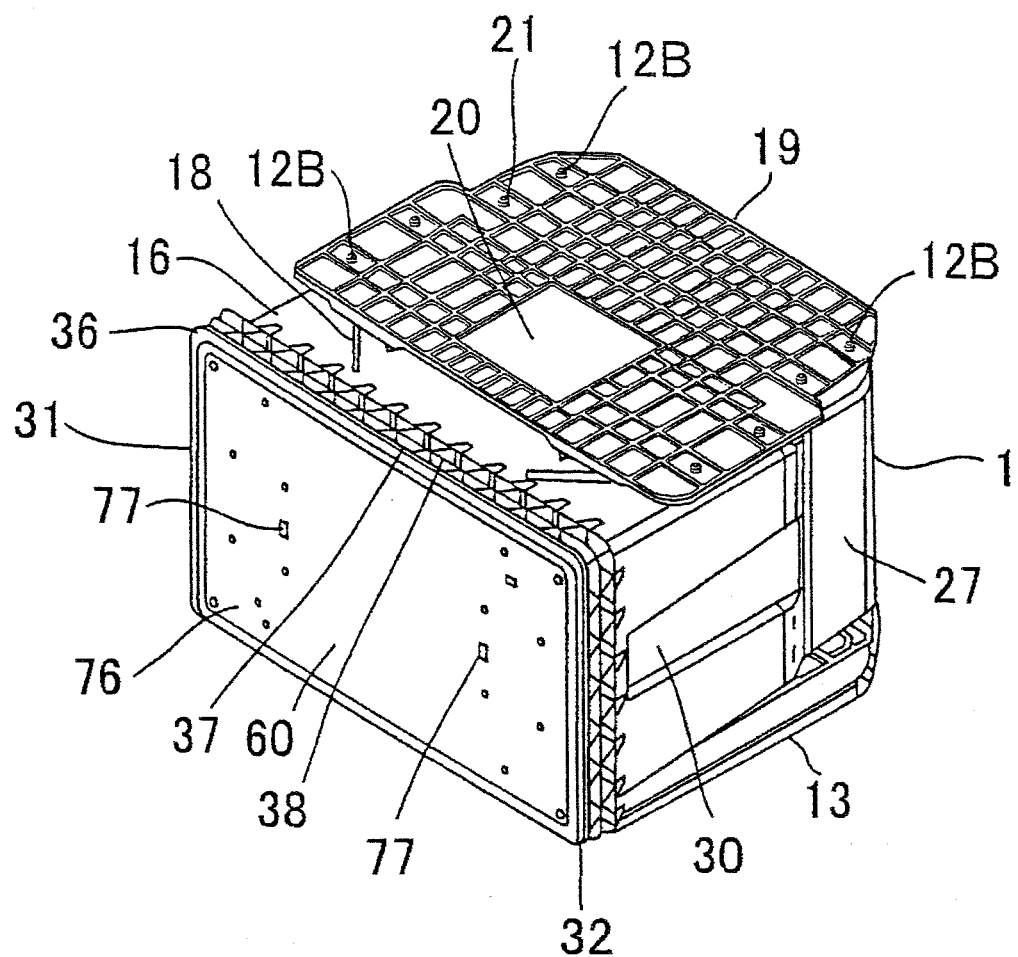
FIG. 1 is a perspective illustrative view schematically showing an embodiment of a substrate storage container.
Figure 2:
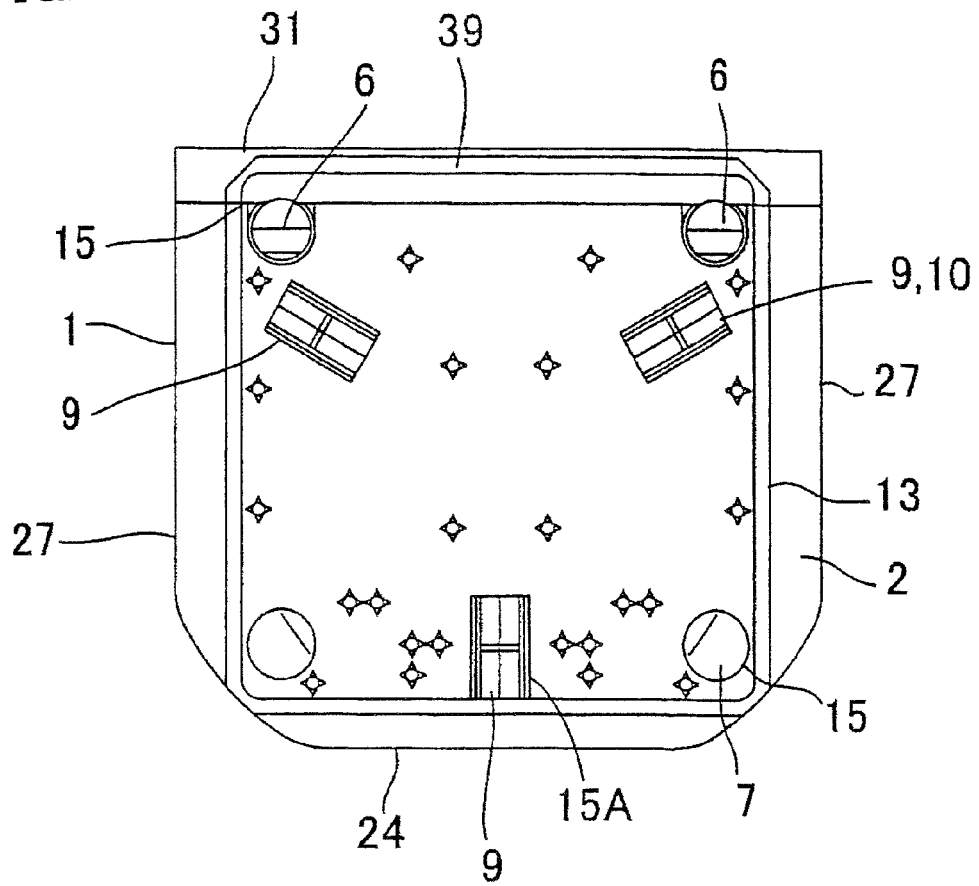
FIG. 2 is a bottom view schematically showing an embodiment of a substrate storage container.
Figure 3:
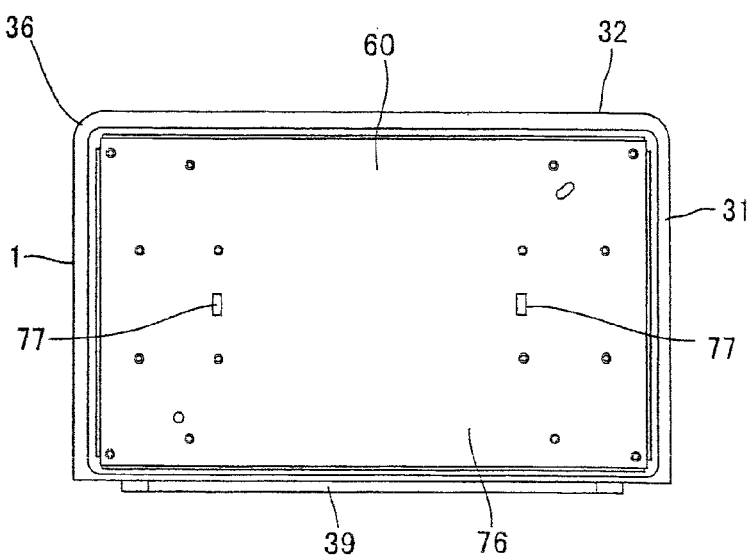
FIG. 3 is a front view schematically showing an embodiment of a substrate storage container.
Figure 4:
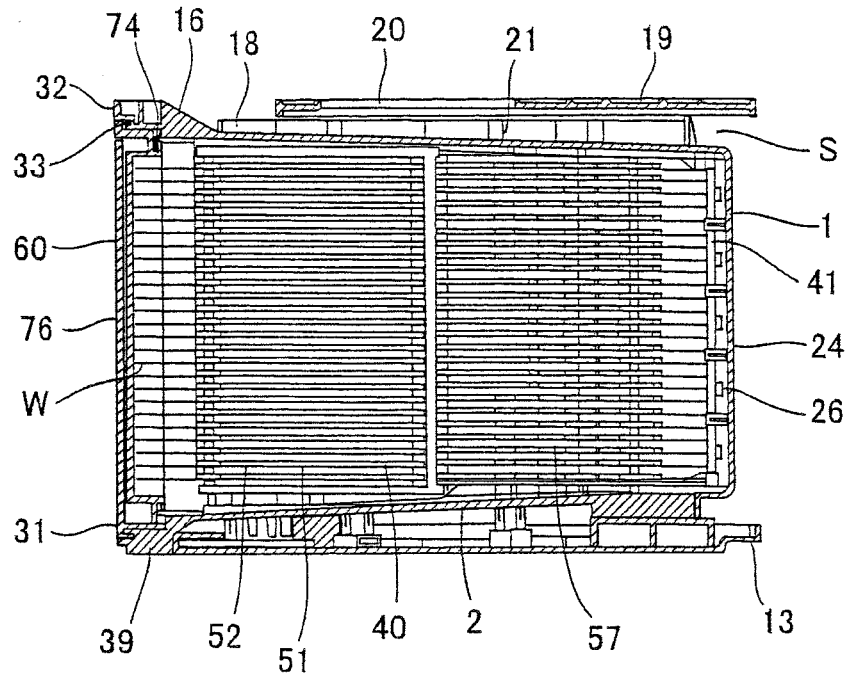
FIG. 4 is a sectional side view schematically showing an embodiment of a supporting body and a substrate storage container.
Figure 5:
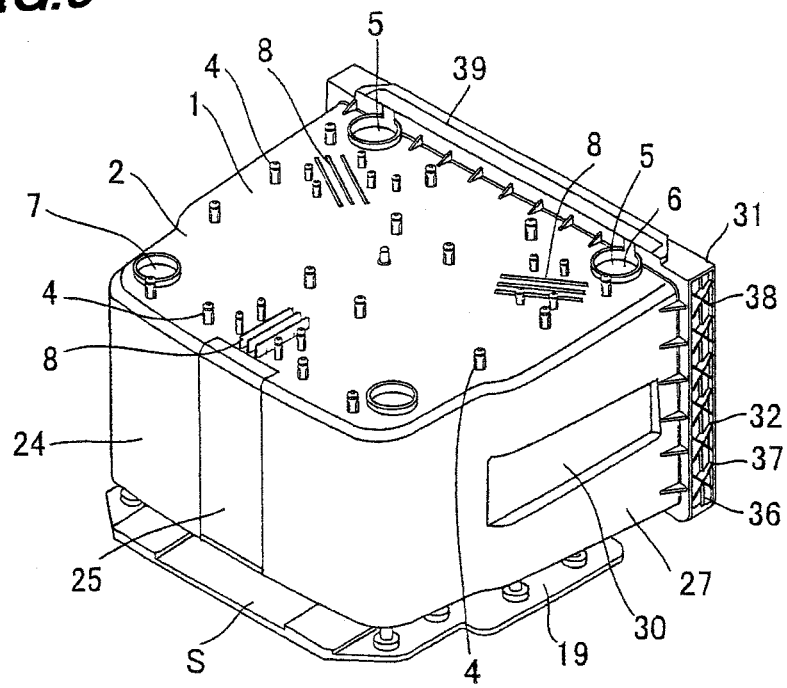
FIG. 5 is a perspective illustrative view schematically showing a container body in an embodiment of a substrate storage container.
Figure 6:
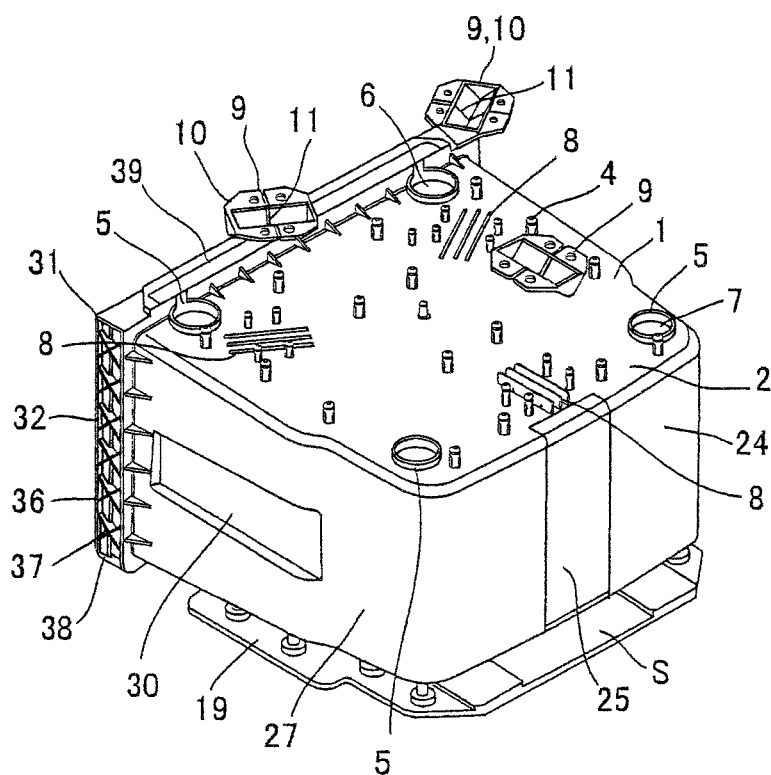
FIG. 6 is a perspective illustrative view showing a container body and positioning parts in an embodiment of a substrate storage container.
Figure 7:
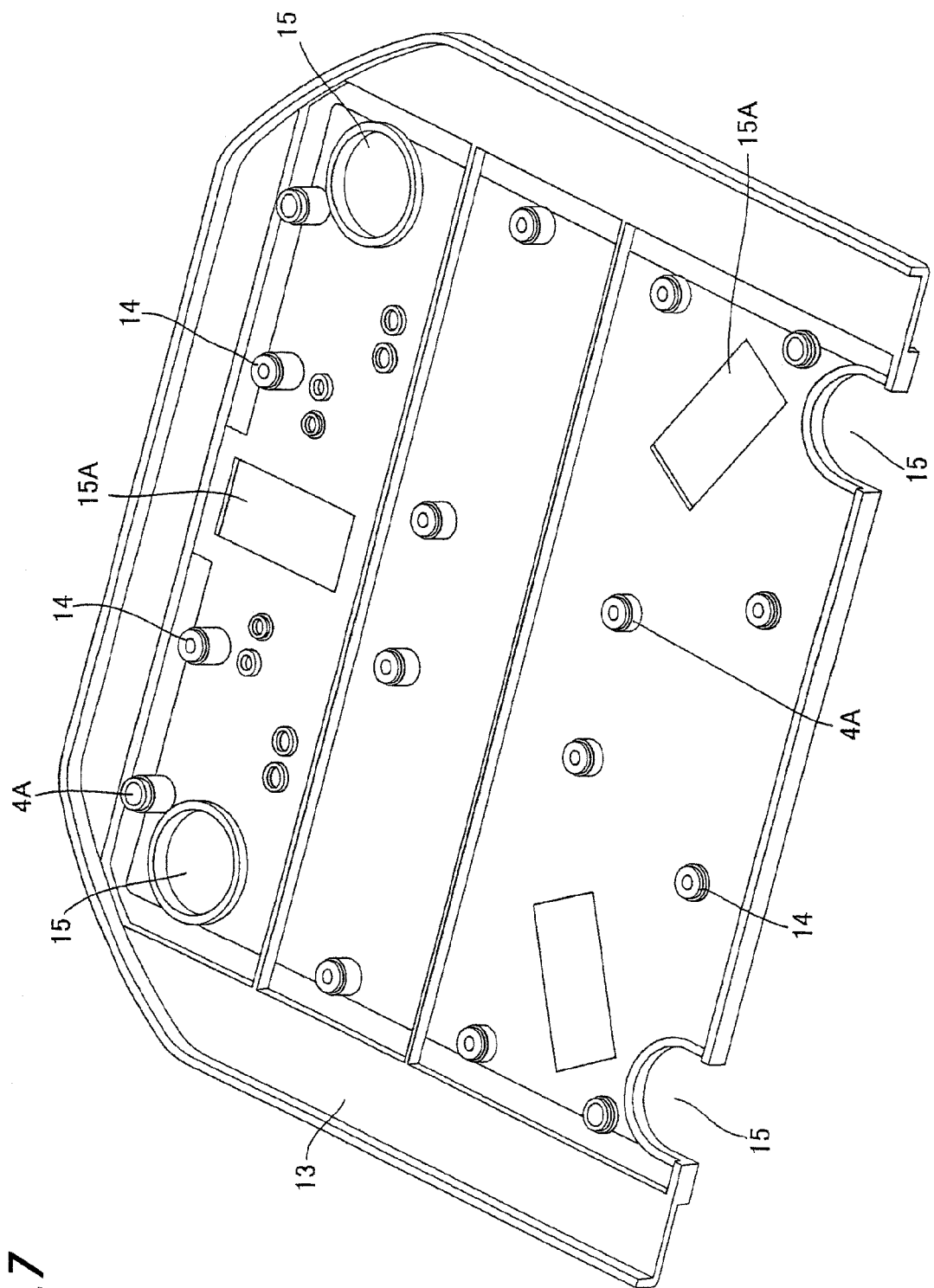
FIG. 7 is a perspective illustrative view schematically showing a bottom plate in an embodiment of a substrate storage container.
Figure 8:
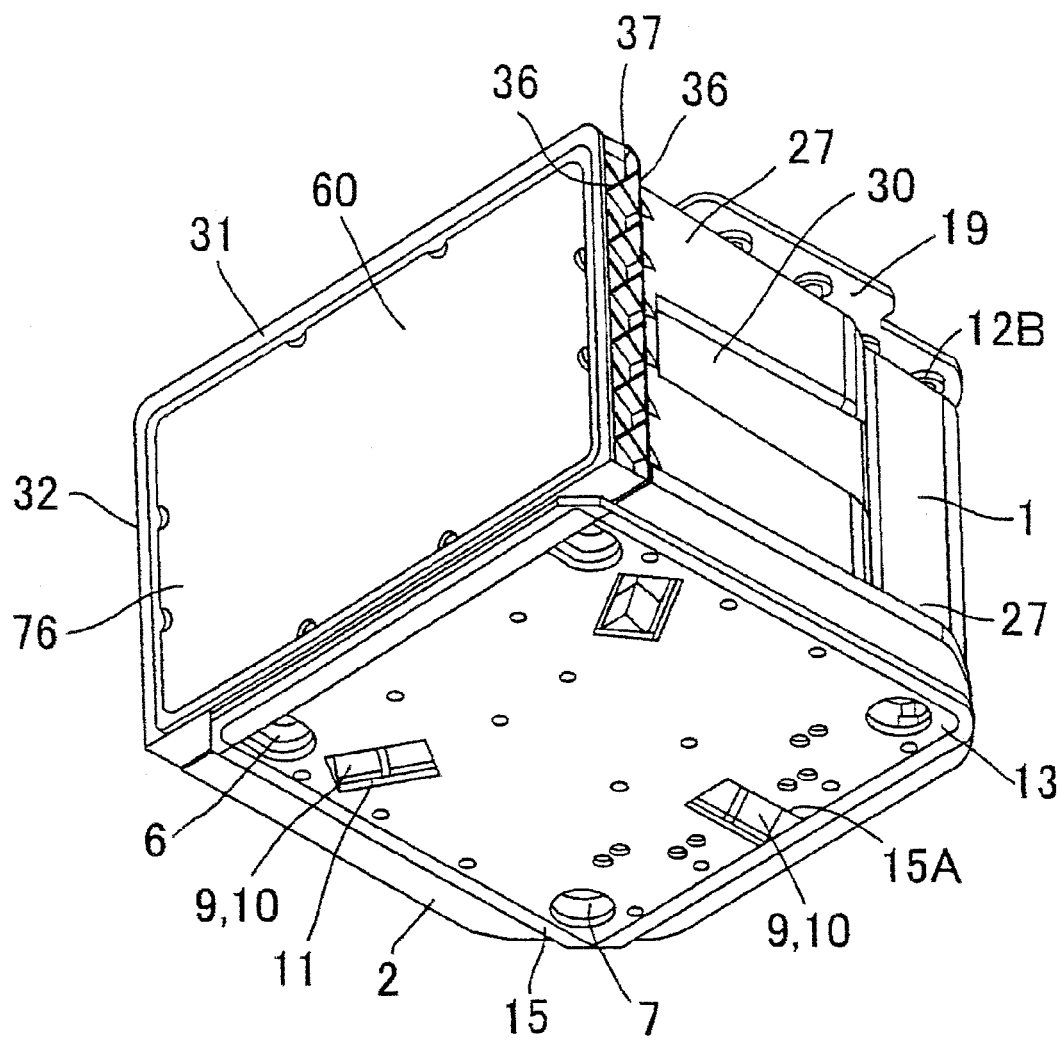
FIG. 8 is a perspective illustrative view from the bottom side schematically showing an embodiment of a substrate storage container.
Figure 9:
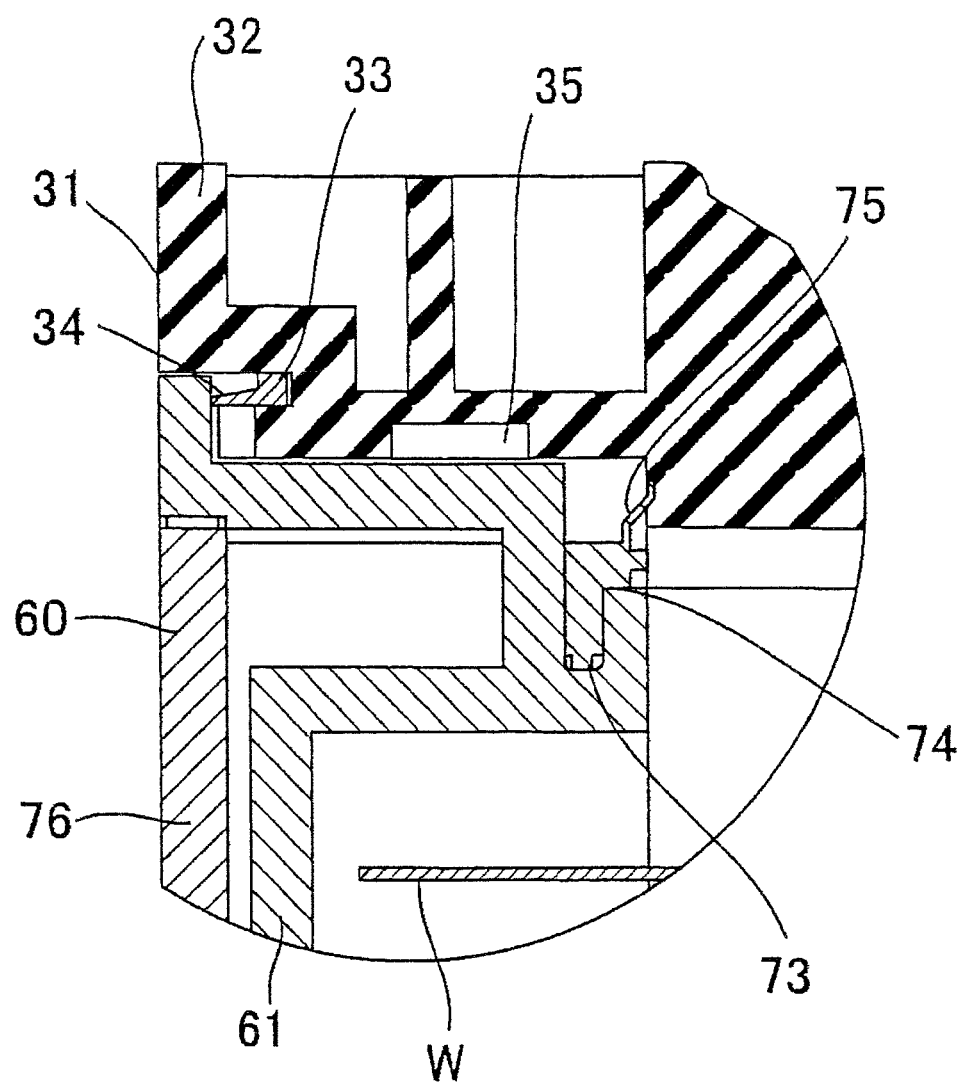
FIG. 9 is a partial sectional illustrative view schematically showing the front part of a container body and a door in an embodiment of a substrate storage container.
Figure 15:
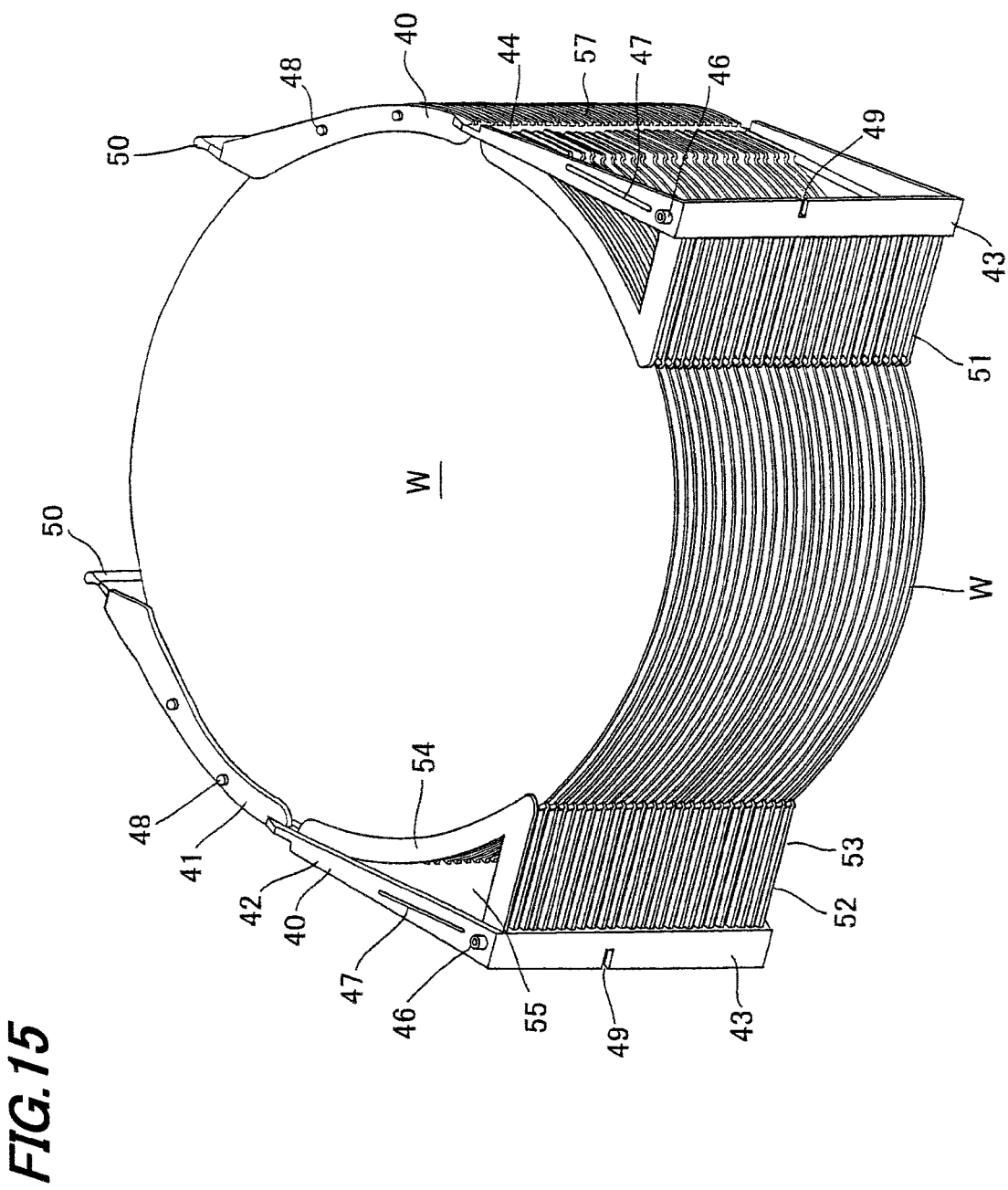
FIG. 15 is a perspective illustrative view showing a supported condition of semiconductor wafers in an embodiment of supporting bodies.
Figure 16:
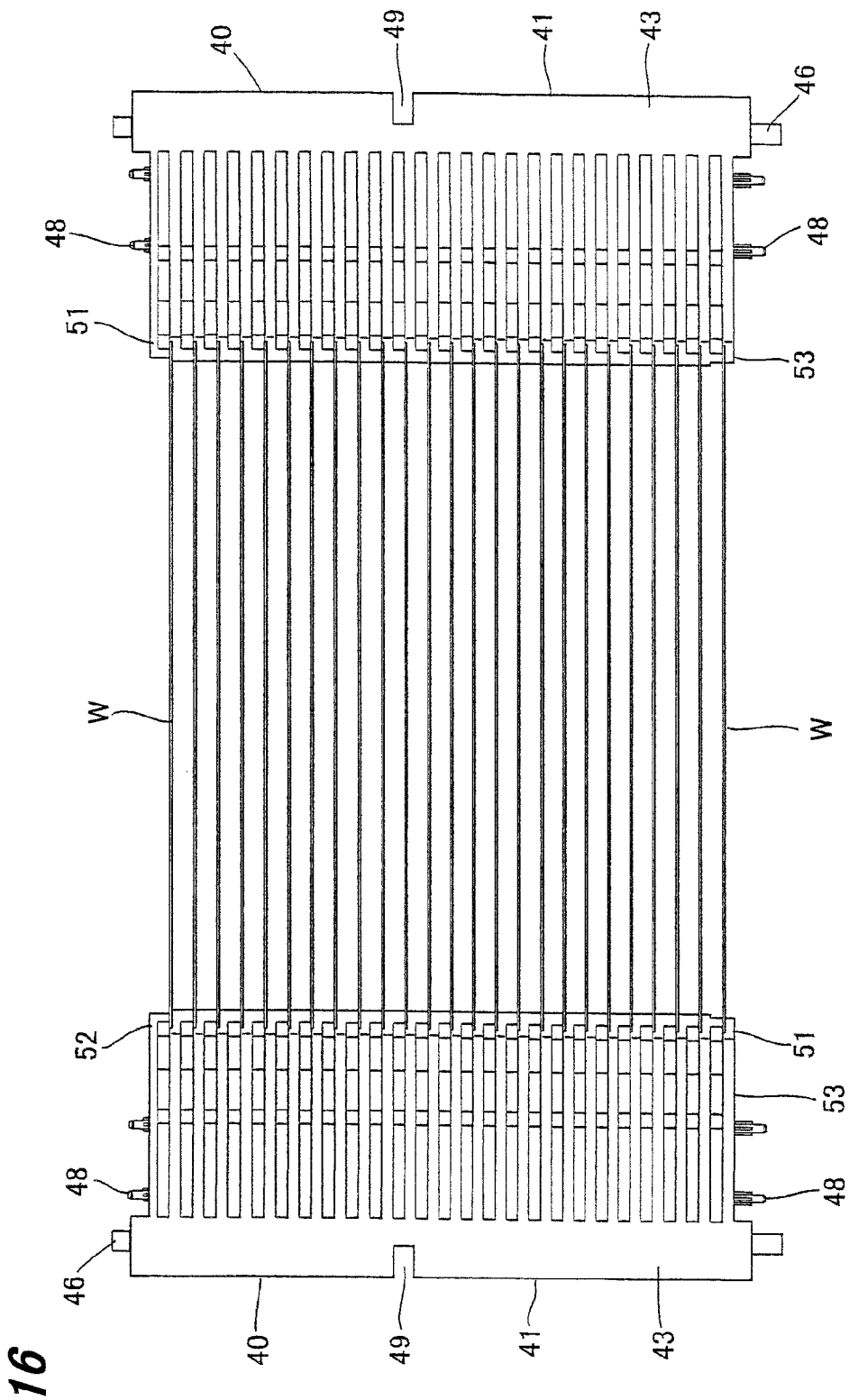
FIG. 16 is a front view schematically showing an embodiment of supporting bodies.
Figure 17:
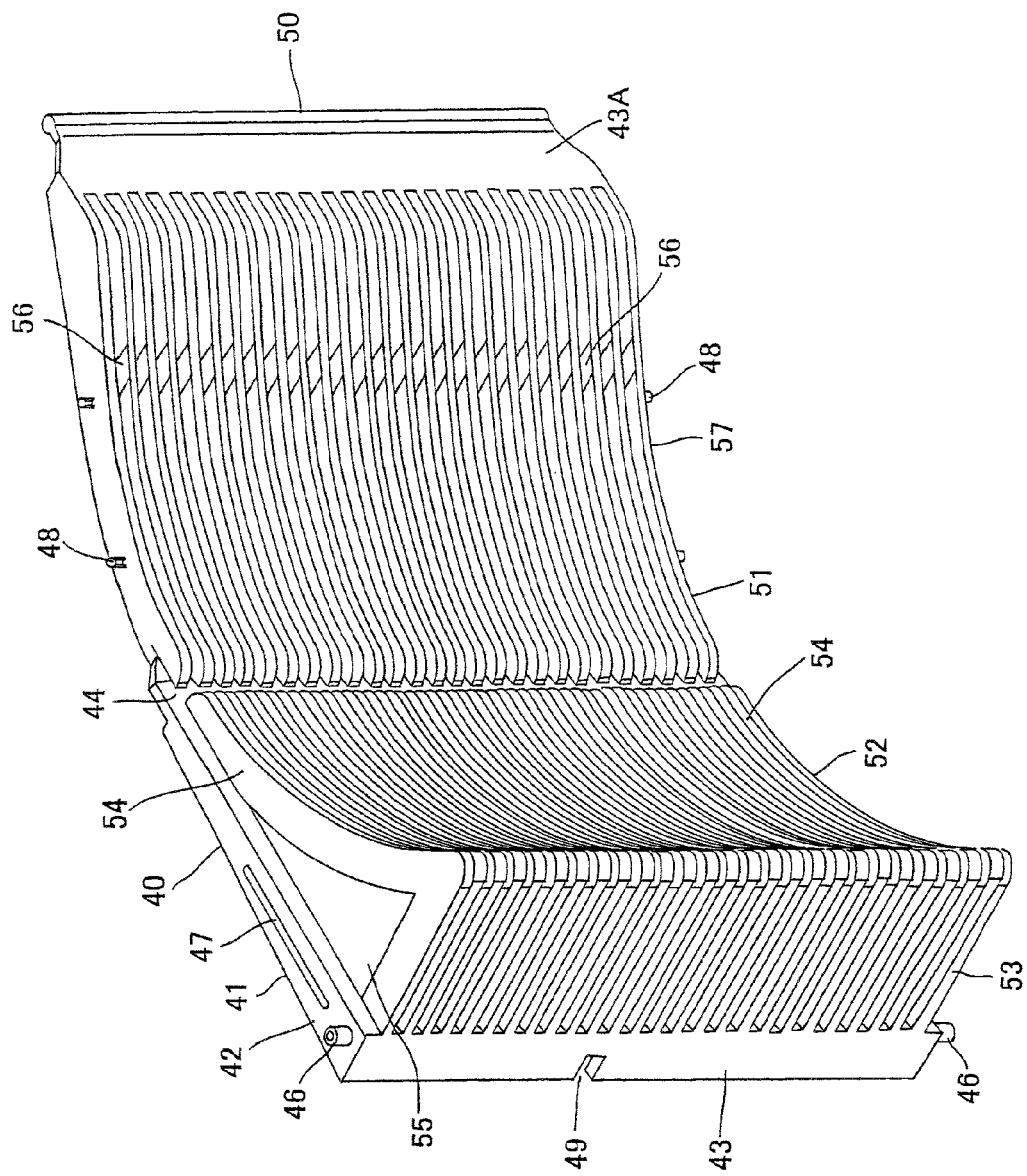
FIG. 17 is a perspective illustrative view schematically showing an embodiment of a supporting body.
Figure 18:
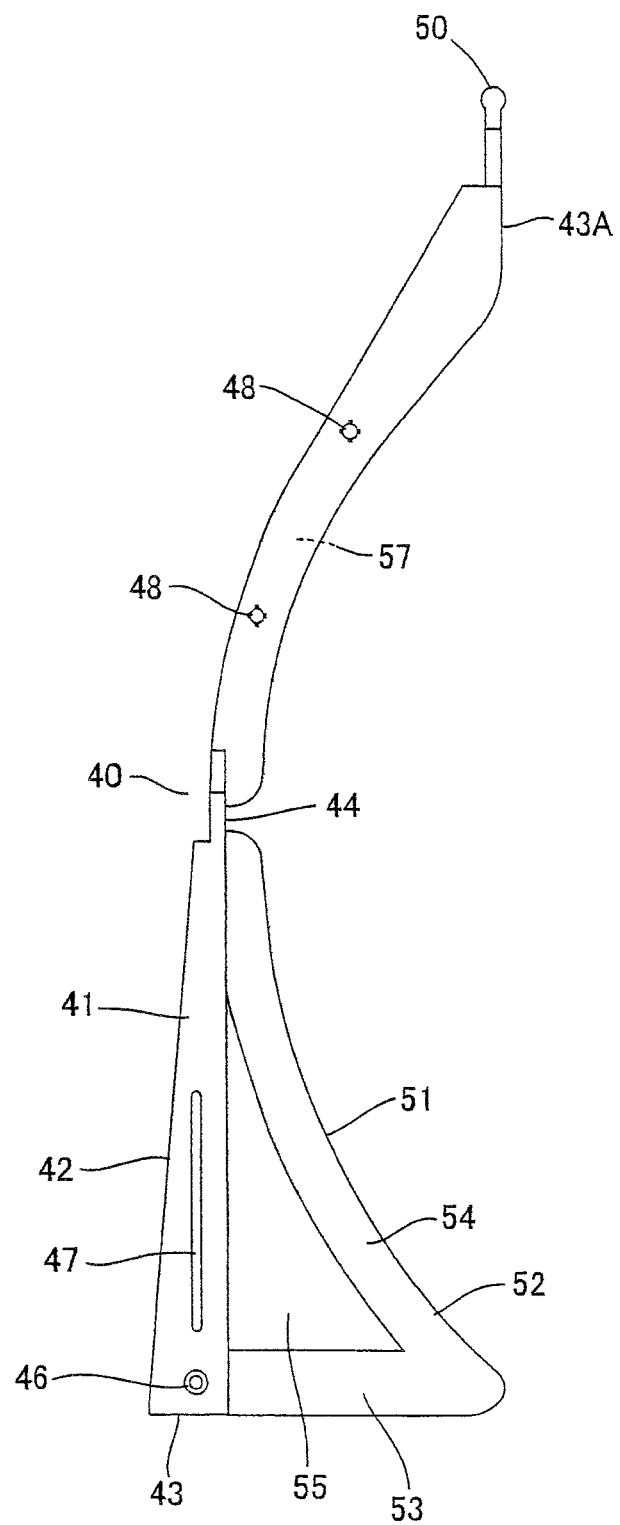
FIG. 18 is a top view schematically showing an embodiment of a supporting body.
Figure 19:
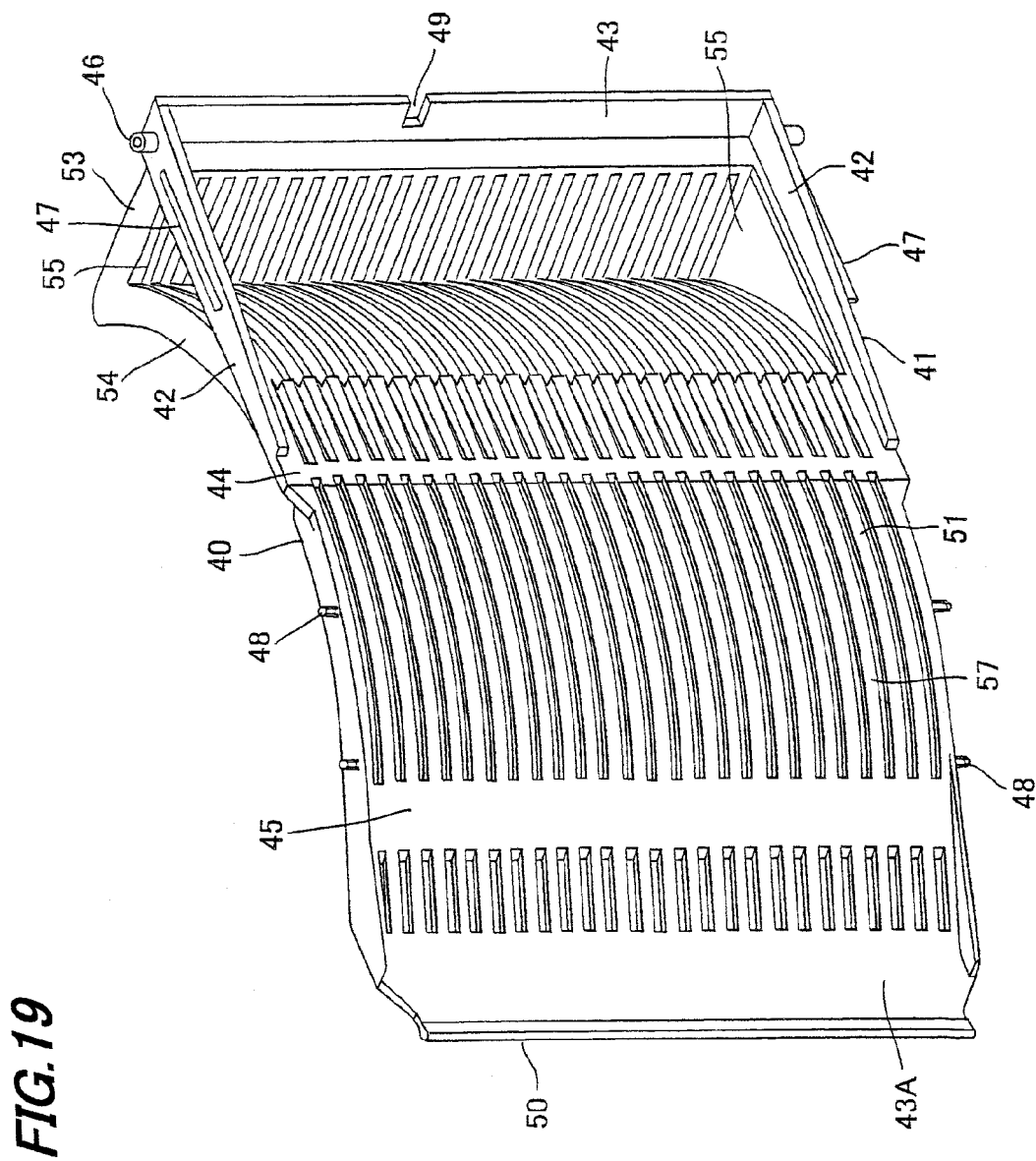
FIG. 19 is a perspective illustrative view from the rear side schematically showing an embodiment of a supporting body.
Figure 20:
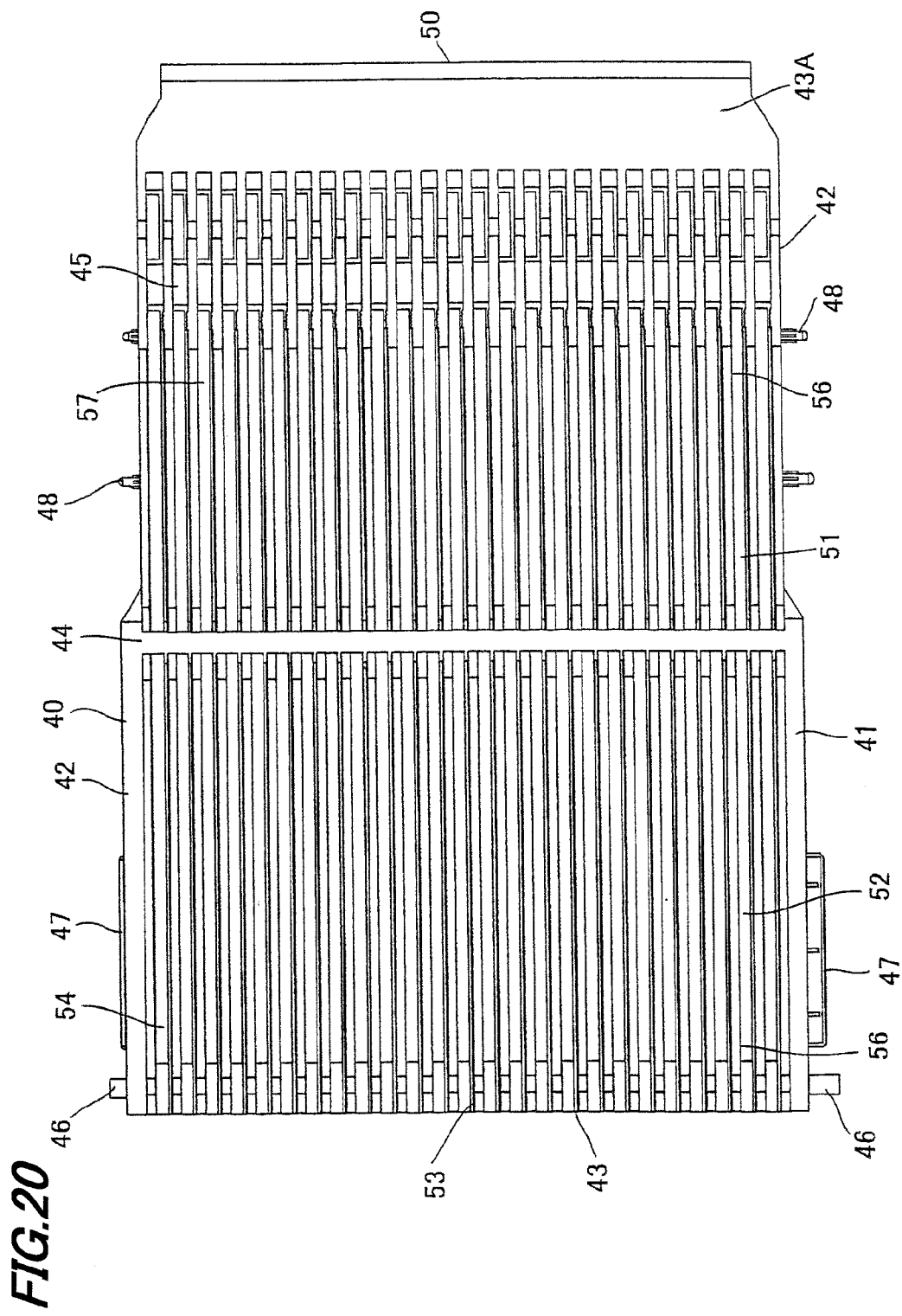
FIG. 20 is an illustrative view schematically showing an embodiment of a supporting body.
Figure 21:
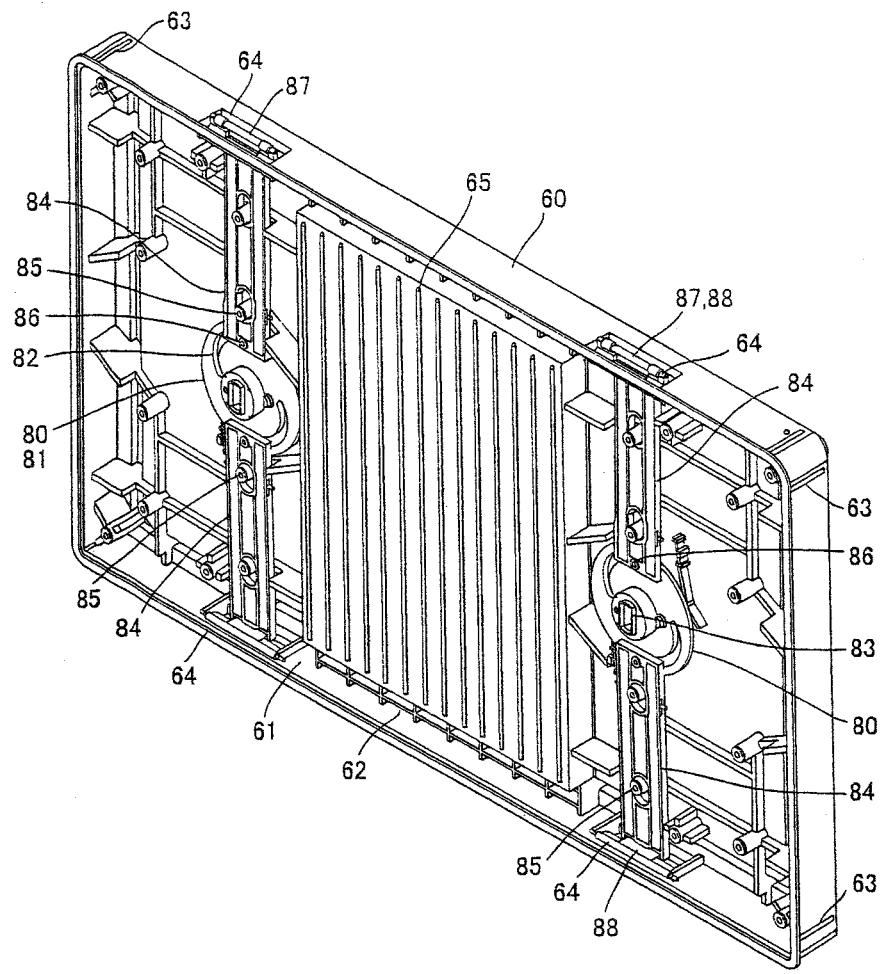
FIG. 21 is a perspective illustrative view schematically showing the front side of a casing in an embodiment of a substrate storage container.
Figure 22:
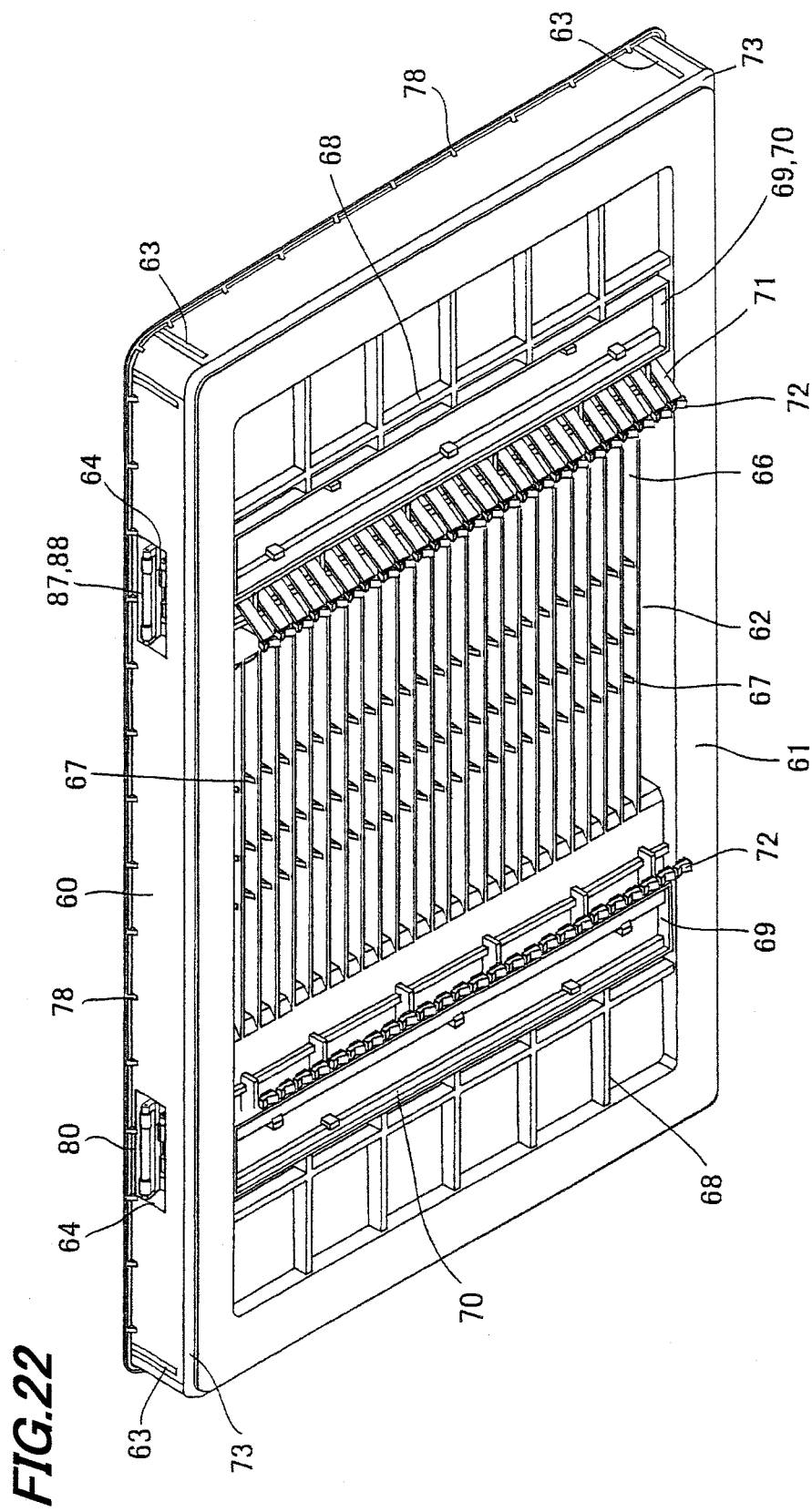
FIG. 22 is a perspective illustrative view schematically showing the rear side of a door in an embodiment of a substrate storage container.

As shown in FIGS. 4, 15 and 16, semiconductor wafer W is a φ450 mm silicon wafer having a thickness of, for example 925 μm, having unillustrated notches of semicircular forms when viewed from top, for positioning and identification, cut out at the peripheral edge. Twenty-five wafers are accommodated in alignment in container body 1.

Container body 1 and door 60 are injection-molded separately by injecting molding material including predetermined resin into dedicated molds. As the predetermined resin in this molding material, polycarbonate, polyetheretherketone, polyetherimide and cycloolefin polymer and other resins, which are excellent in, for instance, dynamical property, heat resistant property, etc., can be listed. Carbon, carbon fiber, metal fiber, carbon nanotubes, conductive polymers, antistatic agents, flame retarders and others can be optionally added as necessary.

As shown in FIGS. 1, 2, 4 to 6, 8 and 10 to 14, container body 1 is given in a form of an opaque front open box type including: a base plate 2 that is greater than semiconductor wafer W; a top plate 16 opposing this base plate 2 from the top across the accommodation space of semiconductor wafers W; a rear wall 24 that vertically joins between the rear parts of these base plate 2 and top plate 16; and a pair of left and right side walls 27 that vertically join between base plate 2 and top plate 16 on both the left and right sides. The container body is positioned and mounted on semiconductor processing equipment or gas-replacement equipment with its laterally long open front 31 oriented horizontally.

Figure 11:
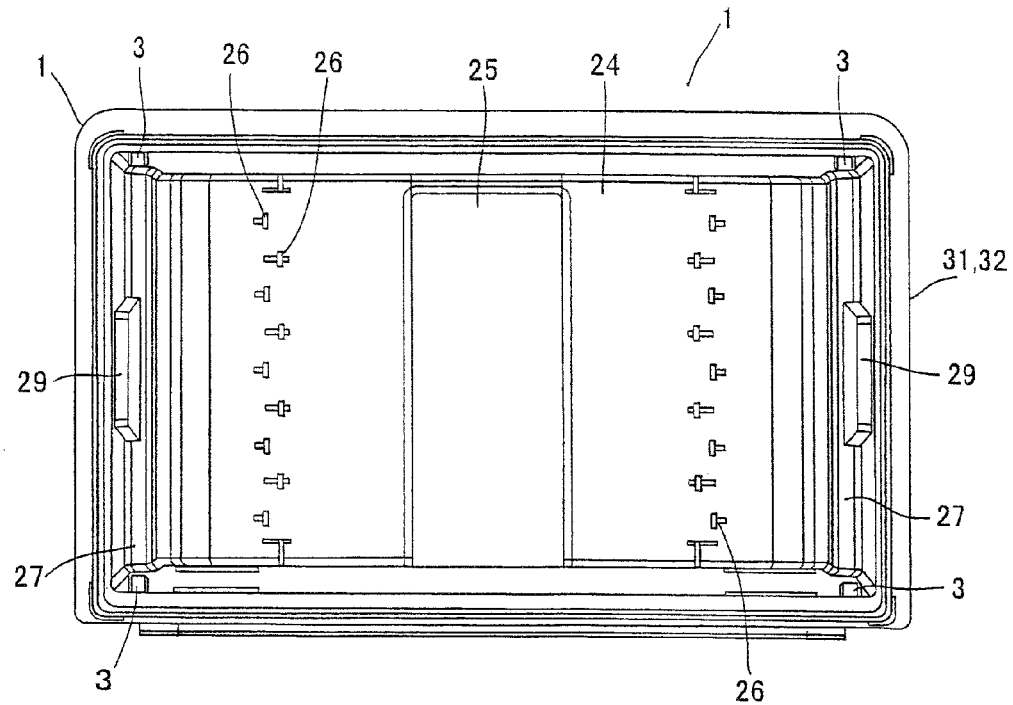
FIG. 11 is an illustrative view schematically showing the interior of a container body in an embodiment of a substrate storage container.
Figure 12:
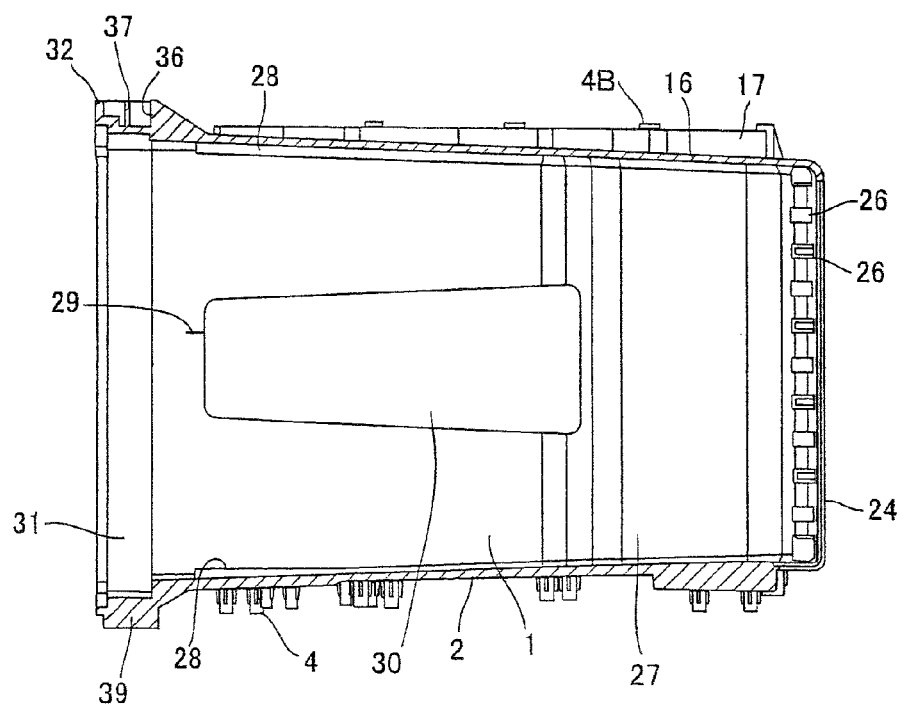
FIG. 12 is a sectional side view schematically showing the interior of a container body in an embodiment of a substrate storage container.
Figure 13:
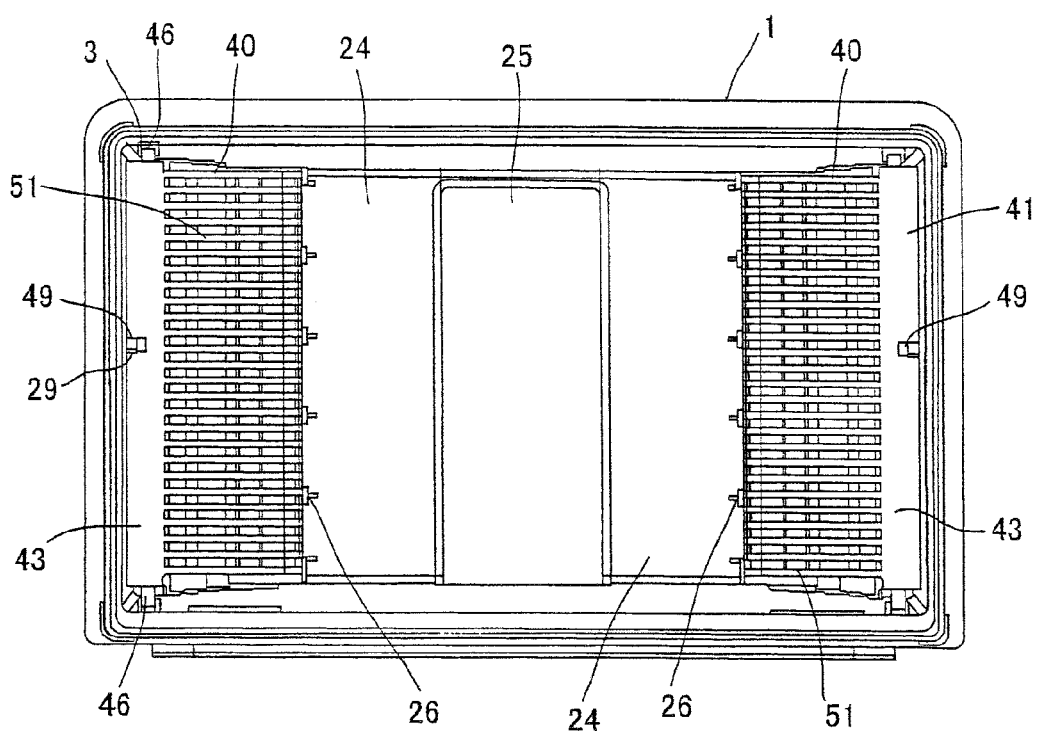
FIG. 13 is a front illustrative view schematically showing the relationship between a container body and supporting bodies in an embodiment of a substrate storage container.
Figure 14:
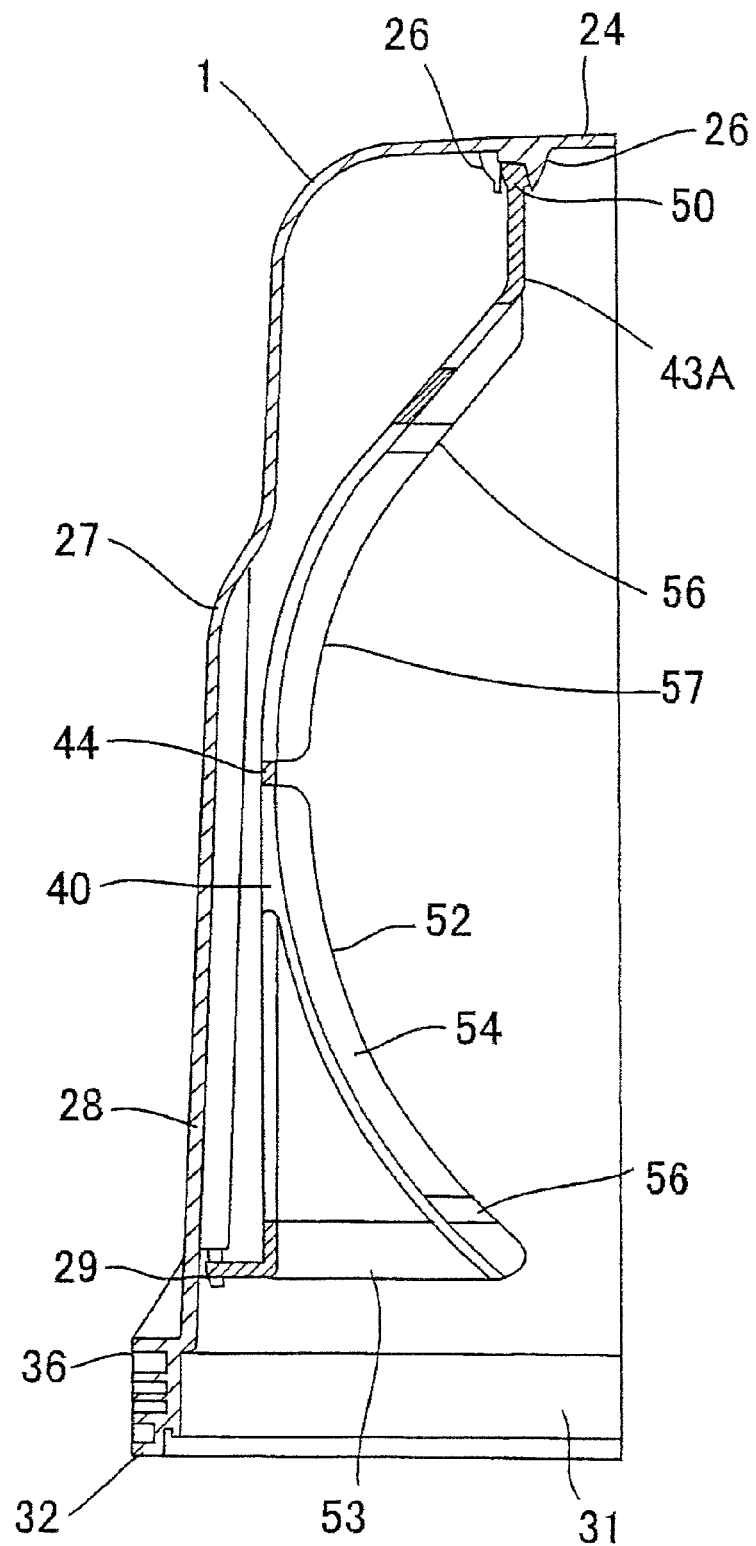
FIG. 14 is a partial sectional illustrative view schematically showing the relationship between a container body and a supporting body in an embodiment of a substrate storage container.

Base plate 2 and top plate 16 are basically formed so as to be wider and longer on the front 31 side of container body 1 and narrower and shorter on the rear wall 24 side, forming an approximate trapezoid when viewed from top and inclined so as to come gradually closer to each other as they go from the front 31 side toward rear wall 24 (see FIG. 4). Formed at upper and lower four corners on the front 31 side in the inner surface of this base plate 2 and top plate 16 are U-shaped or V-shaped left-and-right attachment grooves 3 for supporting body 40, as shown in FIGS. 11 and 13.

Base plate 2 is formed with many screw bosses 4 having bottomed cylindrical forms and has cylindrical filter bosses 5 provided penetrating therethrough at the four corners. An air inlet filter 6 and an air outlet filter 7 for communication between the interior and exterior of container body 1 are detachably fitted to each of the multiple filter bosses 5 with an O-ring interposed therebetween. These air inlet filter 6 and air outlet filter 7 include, for example a one-way valve therein; when this one-way valve is incorporated, the one-way valve is connected to gas-replacement equipment and functions so that the air in container body 1 is replaced by nitrogen gas to thereby prevent the surface of semiconductor wafers W from being oxidized, etc.

A plurality of elongate height adjusting plates 8 are arranged with a predetermined pitch at the both sides on the front and at the rear center of base plate 2. Positioning part 9 for positioning container body 1 is screw-fixed to the plural height adjusting plates 8 by means of fastening screws and screw bosses 4. Each positioning part 9 includes a pair of positioning blocks 10 that are in contact between the multiple height adjusting plates 8. The paired positioning blocks 10 are arranged opposing each other, leaving a small draining space 11 therebetween. The paired opposing positioning blocks 10 are screw fixed by fastening screws and screw bosses 4 of base plate 2.

Each positioning block 10 basically has an approximately square configuration, when viewed from top, having a downward depressed portion defined by a pair of slopes that form an approximately V-shaped cross section, and having attachment flanges 12 that are horizontally projected on both sides, and makes its depressed portion fit over, and into contact with, the positioning pin of semiconductor processing equipment or gas-replacement equipment to provide the function of positioning container body 1 with high precision.

A bottom plate 13 that covers base plate 2 while exposing multiple air inlet filters 6, air outlet filters 7 and positioning parts 9 is horizontally screw-fitted to screw bosses 4 of base plate 2 by means of fastening screws. This bottom plate 13 is given in a similar form to, but one size smaller than, base plate 2, raised up along the periphery for reinforcement, and optionally formed at both the left and right sides with a pair of conveyor rails for transportation.

The opposing inner surface of bottom plate 13 that opposes base plate 2 is formed with linear reinforcement ribs, a plurality of cylindrical screw bosses 4A and positioning bosses 14. Bottom plate 13 is positioned with high accuracy to base plate 2 by penetrating screws through these multiple screw bosses 4A and positioning bosses 14 and fastening the screws to screw bosses 4 on base plate 2. A circular or semicircular exposure hole 15 that is arranged close to air inlet filter 6 and air outlet filter 7 for their exposure is formed at around each of the four corners of bottom plate 13 while square exposure holes 15A that each are arranged close to positioning part 9 for its exposure are formed at the both sides on the front and at the rear center of bottom plate 13.

Formed near exposure hole 15A in the rear part of bottom plate 13 are a plurality of identification holes. Each of a plurality of these identification holes is selectively inserted with an unillustrated removable information identification pad, so that the type of the substrate storage container, the number of semiconductor wafers W and others are identified by semiconductor processing equipment and the like.

Figure 10:
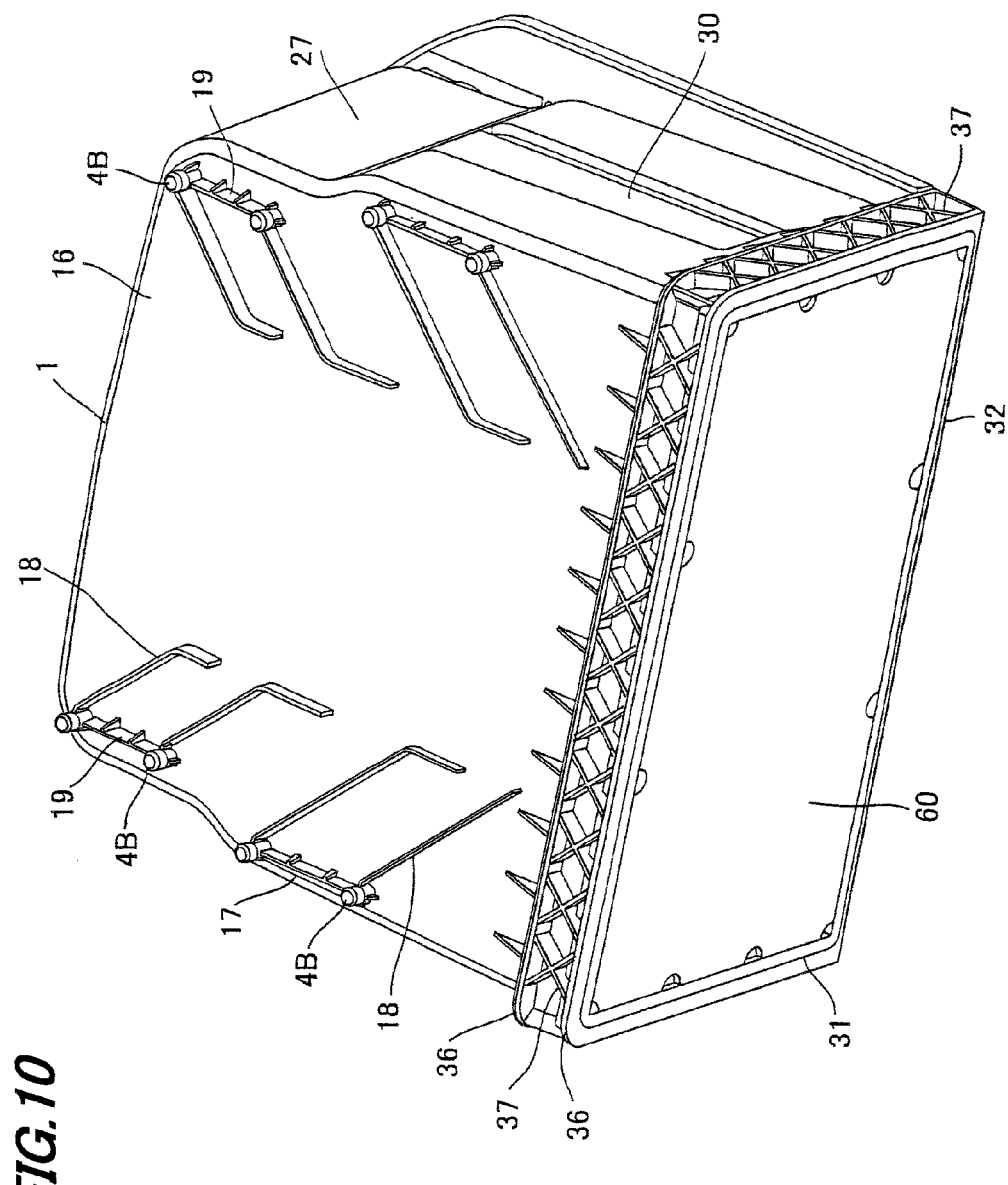
FIG. 10 is a perspective illustrative view schematically showing a top plate of a container body in an embodiment of a substrate storage container.

In the vicinity of the ridges between top plate 16 and side wall 27 which are hard to bend, or in other words, in both lateral sides of top plate 16, pairs of opposing screw bosses 4B are arranged in the front and rear on the top of each side wall 27, as shown in FIG. 10. A top flange 19 for transportation, to be held by an overhead transport mechanism in the factory, is horizontally screw-fixed to these multiple pairs of screw bosses 4B by fastening screws. Each pair of screw bosses 4B are formed with a reinforcing connecting rib 17 that will be in contact with the underside of top flange 19. Each screw boss 4B is given in a cylindrical form having a bottom, and a reinforcing rib 18 that is obliquely extended inwards and forwards of container body 1 is integrally formed from the peripheral side of the screw boss.

Top flange 19 is formed to be a polygonal flat plate having a wider and longer side on the front 31 side of container body 1 and a narrower and shorter side on the rear wall 24 side, and formed with a square hole 20 having a rectangular shape when viewed from top, which the holding prongs of the overhead transport system are passed through to interfere therewith. Formed along both side edges of this top flange 19 are screw holes 21 and positioning bosses 12B which are projected downwards opposing screw bosses 4B of top plate 16. Fastening screws that penetrate through these screw hole 21 and positioning boss 12B are screw fitted into screw bosses 4B of top plate 16, whereby top flange 19 is positioned to top plate 16 with high precision and creates a sectioned space S between these 16 and 19 that allows for entrance of the fork of the overhead transport mechanism (see FIG. 4).

As shown in FIGS. 5, 6, 11 and 14, rear wall 24 has a vertically long, transparent inspection window 25 formed in the center by a two-color molding process or the like, so that the interior of container body 1 and semiconductor wafers W can be visually observed and grasped through the inspection window 25 from the outside. In both side areas on the interior of this rear wall 24, pairs of vertically and diagonally arranged fall stoppers 26 for positioning and holding the backside of supporting bodies 40 from the front backside are provided. These multiple pairs of vertically and diagonally arranged fall stoppers 26 are arranged in the veridical direction on rear wall 24 with a predetermined pitch.

As shown in FIGS. 1, 5, 6, 12 and 14, each side wall 27 is formed in conformity with the shapes of base plate 2 and top plate 16 so that the front part is shaped in an approximately linear flat form while the rear part is shaped in a shape inclined and curved inwards of base plate 2 and top plate 16. This rear part is integrally joined to the lateral parts of rear wall 24.

A pair of fitting rails 28 for supporting body 40 are formed at the top and bottom on the inner surface of each side wall 27, from the front 31 toward the middle part of container body 1. A key-equipped stopper 29 for supporting body 40, positioned on the front 31 side of container body 1, is formed on the inner surface of each side wall 27. On the outer surface of side wall 27, an approximately trapezoidal grip 30 that can interact with fingers etc., in addition to providing reinforcement and anti-deformation, is dented extending from the front to rear. This grip 30 is located on the opposite side of key-equipped stopper 29.

As shown in FIGS. 1, 5, 6, 8 and 10, a rim flange 32 that extends outwards from the peripheral edge of front 31 of container body 1 is projected and supported by small triangular supporting ribs. Removable door 60 is fitted into this rim flange 32 by means of door opening and closing mechanism. In this rim flange 32, an attachment groove having a frame-like form when viewed from the front is cut out in the internal surface of the flange. A lip type gasket 33 that comes in pressure contact with door 60 is tightly fitted into this attachment groove. Engagement holes 35 located in the rear of gasket 33 are formed on both sides at the top and bottom of the internal surface of the flange.

Gasket 33 is molded in an elastically deformable frame-like form using molding material excellent in, for example, heat resistance, weather resistance and the like, such as fluoro rubber, silicone rubber, various kinds of thermoplastic elastomers (e.g., olefin, polyester and polyethylene and other kinds of elastomers), and an endless tapered projected part 34 that extends in the direction to the front 31 side of container body 1 is integrally formed with the gasket on the surface that opposes door 60. This projected part 34 is formed to be gradually inclined inwards of container body 1 as it goes in the front 31 direction of container body 1 so as to flexibly come into pressure contact with the external surface of the peripheral side of door 60 and thereby ensure airtightness.

On, at least, the top and left and right sides of the external surface of rim flange 32, a pair of front and rear framing ribs 36 are formed and arranged apart from each other. Formed between the paired framing ribs 36 are a plurality of X-ribs 37 that enhance strength. A plate-like strength reinforcing rib 38 that partitions multiple X-ribs 37 into front and rear parts is optionally formed integrally between the paired framing ribs 36, at least, in the lateral sides. This strength reinforcing rib 38 further improves the rigidity of rim flange 32. Further, a conveyor rail 39 for transportation, located in the front of bottom plate 13 is formed at the bottom of the peripheral side of rim flange 32.

Each supporting body 40 is formed by injection molding of molding material including predetermined resin such as polybutylene terephthalate, polyetheretherketone, polycarbonate, COP or the like, which are excellent in smoothability. This molding material is optionally added with carbon fiber, metal fiber, carbon nanotubes, conductive polymers, resin given with conductivity and the like, as necessary.

As shown in FIGS. 13 to 20, each supporting body 40 includes a frame 41 opposing the internal surface of side wall 27 of container body 1 and a plurality of supporting members 51 vertically arranged and projected from this frame 41 to support semiconductor wafers W. Each supporting member 51 is formed of a front supporting piece 52 that is horizontally and laterally projected from frame 41 and horizontally supports the peripheral edge of semiconductor wafer W at, at least, the lateral side in front, and a rear supporting piece 57 that is horizontally and laterally projected from frame 41 and horizontally supports the periphery edge of semiconductor wafer W at, at least, the lateral side in the rear. The supporting bodies are removably attached to the internal surface of side walls 27 of container body 1.

Frame 41 is given in a laterally long form including a pair of top and bottom crossrails 42 arranged apart from and opposing to each other and a pair of stiles 43 and 43A arranged vertical at the front and rear between the pair of crossrails 42. Paired crossrails 42 are joined at the middle points by a vertical bar-shaped sectioning joint piece 44 that sections the space inside frame 41 and joined at their rear points by a vertically arranged plate-like reinforcing joint piece 45. The rear part of each of paired crossrails 42 is gradually curved inwards of container body 1 so as to go along the lateral side in the rear of the peripheral edge of semiconductor wafer W similarly to multiple rear supporting pieces 57.

Attachment pins 46 that detachably fit into left or right attachment grooves 3 of container body 1 to position supporting body 40 with respect to the left and right direction are formed in the front-most part of each crossrail 42 so as to be projected upwards and downwards. A plate-like positioning attachment piece 47 that is arranged in the rear of and lower than attachment pin 46 is projectively formed upwards or downwards in the front part of each cross rail 42. This positioning attachment piece 47 is held by fitting rail 28 of side wall 27 so that supporting body 40 is positioned with respect to the vertical direction. Further, a plurality of height adjustment pins 48 that will be in contact with the interior surface of base plate 2 or top plate 16 are disposed at intervals in the longitudinal direction in the rear part of crossrail 42. These multiple height adjustment pins 48 properly adjust the heights of frame 41 and multiple supporting members 51 with respect to the vertical direction.

An attachment groove 49 corresponding to the attachment claw on the internal surface of side wall 27 is cut out in the middle of front stile 43 while an expanded attachment piece 50 extended vertically and having an approximately circular section is integrally formed at the end of rear stile 43A. This expanded attachment piece 50 is positioned and held by pairs of diagonal fall stoppers 26 of container body 1, so as to effectively prevent supporting body 40 from falling inside container body 1. Attachment groove 49 is cut out in a rectangular shape and fits on key-equipped stopper 29 of container body 1 so as to prevent supporting body 40 from falling off or flying out from container body 1 toward the front 31 side.

Front supporting piece 52 includes: a long flat plate-like projected part 53 that linearly and horizontally extends from the front part of frame 41 or from front stile 43, toward the front peripheral edge of semiconductor wafer W; and a flat plate-like curved part 54 that extends rearwards from the tip of projected part 53 and curves along the peripheral edge of semiconductor wafer W so that the rear end of curved part 54 is joined to sectioning joint piece 44, defining a sectioned hollow 55 having an approximately curved triangular shape when viewed from top, with frame 41. A plate-formed supporting rib 56 that will be in contact with, the underside of, or the edge on the underside of, semiconductor wafer W to horizontally support the wafer is formed on the top face in the front part of curved part 54.

Rear supporting piece 57 is given as a flat plate having an approximately semicircular form, when viewed from top, so as to get along the peripheral edge of semiconductor wafer W in the lateral side in the rear, and is horizontally stretched between the rear stile 43A and sectioning joint piece 44 and horizontally supported by reinforcing joint piece 45 so as to be positioned in the rear of the rear end of curved part 54 with a gap in-between. A plate-formed supporting rib 56 that is positioned near reinforcing joint piece 45 is formed on the top face in the rear part of this rear supporting piece 57, and this supporting rib 56 comes in contact with, the underside of, or the edge on the underside of, semiconductor wafer W to horizontally support the wafer in the same manner as supporting rib 56 of front supporting piece 52 does.

Here, it is preferable in view of preventing semiconductor wafer W's sag that the supporting rib 56 of front supporting piece 52 is formed at a position near projected part 53 of curved part 54 and closer, from the vicinity of the maximum diametric point on the side peripheral edge of semiconductor wafer W, to the center line that cut through the center of semiconductor wafer W in container body 1, when viewed from top, than the supporting rib 56 of rear supporting piece 57 is positioned.

As shown in FIGS. 1, 3, 8, 21 through 24, door 60 includes a laterally long casing 61 that fits into open rim flange 32 of container body 1, a front plate 76 covering the open front side (front) of this casing 61 and a locking mechanism 80 interposed between these casing 61 and front plate 76.

Casing 61 basically has a shallow dish-like section with a frame-like peripheral wall, and is formed with a central part 62 that is an approximately box-like configuration, in front view, projected from the back to the front. This central part 62 sectionally defines installation spaces for a plurality of screw bosses and locking mechanism 80 in cooperation with the left and right sides of the peripheral wall. This casing 61 has a plurality of door guides 63 for easy attachment and removal of door 60 at each of four rounded corner of the outer surface of the peripheral wall of this casing 61. Formed at both sides on the top and bottom peripheral walls are through-holes 64 for locking mechanism 80, each through-hole 64 opposing respective engagement hole 35 of rim flange 32.

A plurality of reinforcing ribs 65 that extend in the vertical direction are provided parallel to each other with a predetermined pitch on the raised surface of central part 62 of casing 61 while a plurality of protection shelves 66 that extend in the left and right horizontal direction are arranged vertically, parallel to each other with a predetermined pitch on the depressed rear side of central part 62 so that individual protection shelves 66 partition the front of the peripheral edges of accommodated multiple semiconductor wafers W in a non-contact manner.

Formed on the top and bottom surfaces of protection shelf 66 are a plurality of small triangular interference ribs 67 that can interfere with the front peripheral edge of semiconductor wafer W that is located out of place. Further, a reinforcing grating rib 68 is integrally formed in a vertically-long position on either side of the back of casing 61. Front retainers 69 for repulsively holding semiconductor wafers W are detachably mounted between each grating rib 68 and multiple protection shelves 66.

Each front retainer 69 includes a vertically long frame 70 that is removably attached between grating rib 68 and protection shelves 66 by means of pressing claws and positioned in the rear of locking mechanism 80 so as to prevent deformation of door 60. The stile of frame 70 located close to protection shelves 66 is integrally formed with elastic pieces 71 that each extend obliquely toward protection shelf 66 and are vertically arranged. At the distal end of each elastic piece 71 is integrally formed with a small holding block 72 that has a V-shaped groove to hold the front peripheral edge of semiconductor wafer W.

A frame-shaped fitting groove 73 is formed around the periphery on the rear side of casing 61. Tightly fitted into this fitting groove 73 is a lip type gasket 74 which encloses through-holes 64 and locking mechanism 80 between itself and gasket 33 of rim flange 32. This gasket 74 is put in pressure contact within rim flange 32. This gasket 74 is molded in an elastically deformable frame-like form using molding material excellent in, for example, heat resistance, weather resistance and the like, such as fluoro rubber, silicone rubber, various kinds of thermoplastic elastomers (e.g., olefin, polyester and polyethylene and other kinds of elastomers), and is positioned in the rear of gasket 33.

An endless flexed projected part 75 that extends from the front 31 of container body 1 toward the rear wall 24 side and has an approximately inverted open V-shaped section is integrally formed on the outer peripheral side of gasket 74. This flexed projected part 75 extends outwards from the interior of container body 1 to flexibly come into pressing contact with the inner surface of rim flange 32 and thereby ensure airtightness.

Front plate 76 is given in a form of a laterally long flat plate so as to correspond to the open front of casing 61, and has operational openings 77 for locking mechanism 80 and a plurality of attachment holes, formed on both the left and right sides. The front plate is positioned and fixed to the front of casing 61 by fastening screws that are put through the multiple attachment holes and screwed into screw bosses of casing 61. A plurality of engagement ribs 78 that engage the outer peripheral surface of the peripheral wall of casing 61 are disposed and formed with a predetermined pitch around the peripheral edge of this front plate 76.

Figure 23:
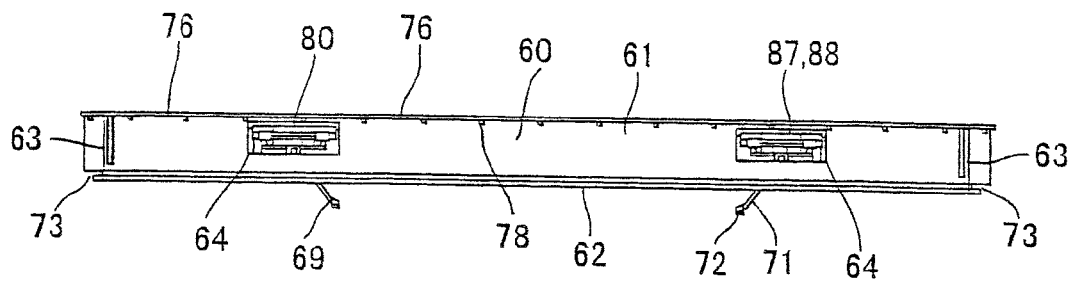
FIG. 23 is a top view schematically showing a door in an embodiment of a substrate storage container.
Figure 24:
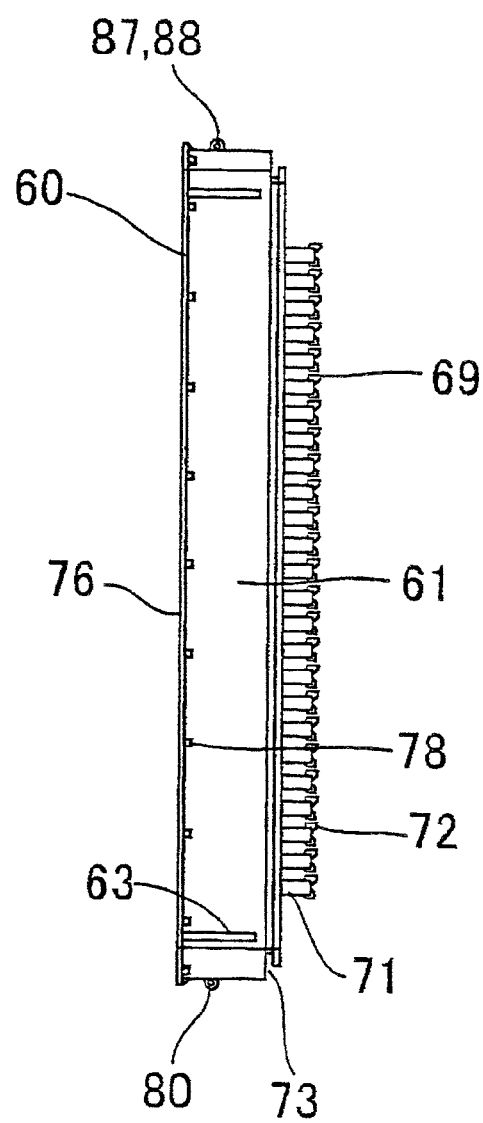
FIG. 24 is a side illustrative view schematically showing a door in an embodiment of a substrate storage container.
Figure 25:
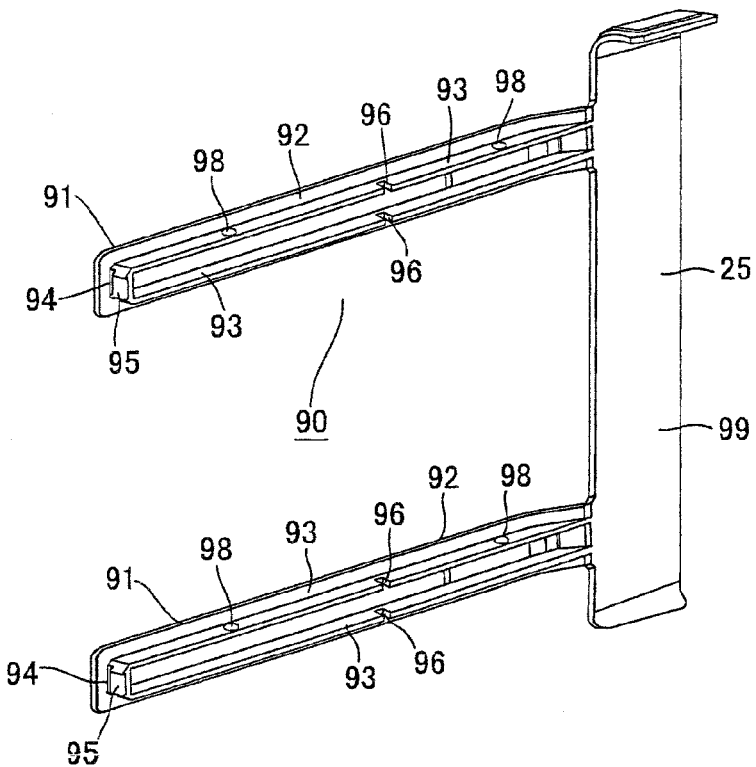
FIG. 25 is a perspective illustrative view schematically showing a supporting structure in a second embodiment of a substrate storage container.
Figure 26:
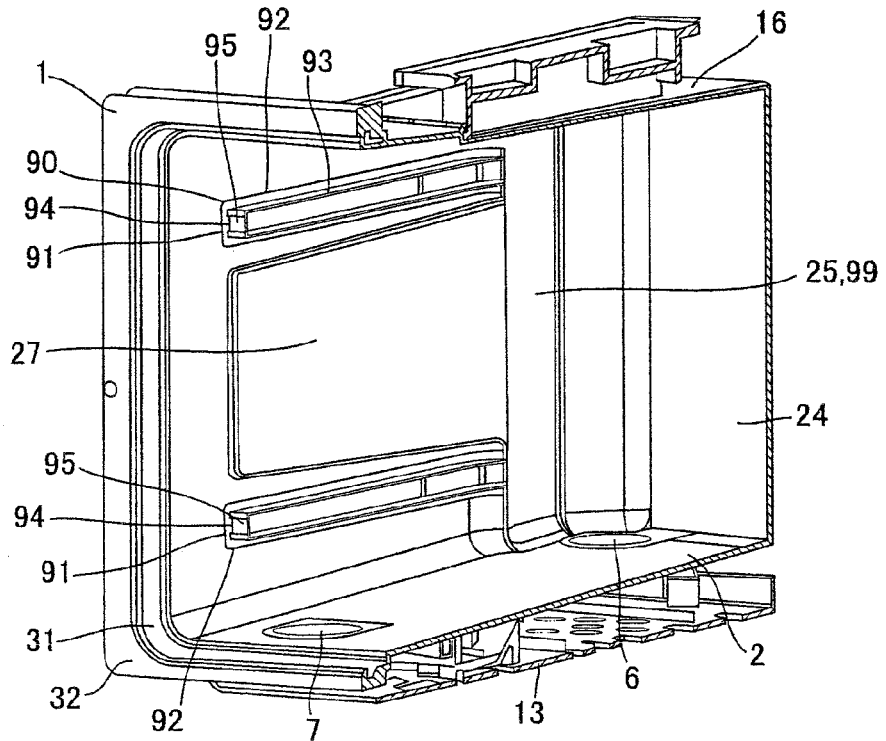
FIG. 26 is a partly cutout perspective illustrative view schematically showing a relationship between a container body and a supporting structure in a second embodiment of a substrate storage container.
Figure 27:
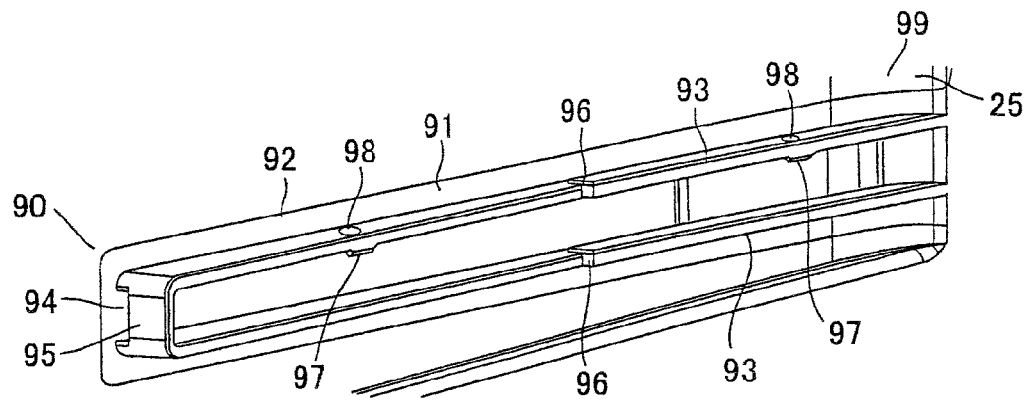
FIG. 27 is a perspective illustrative view schematically showing a supporting rail of a supporting structure in a second embodiment of a substrate storage container.
Figure 28:
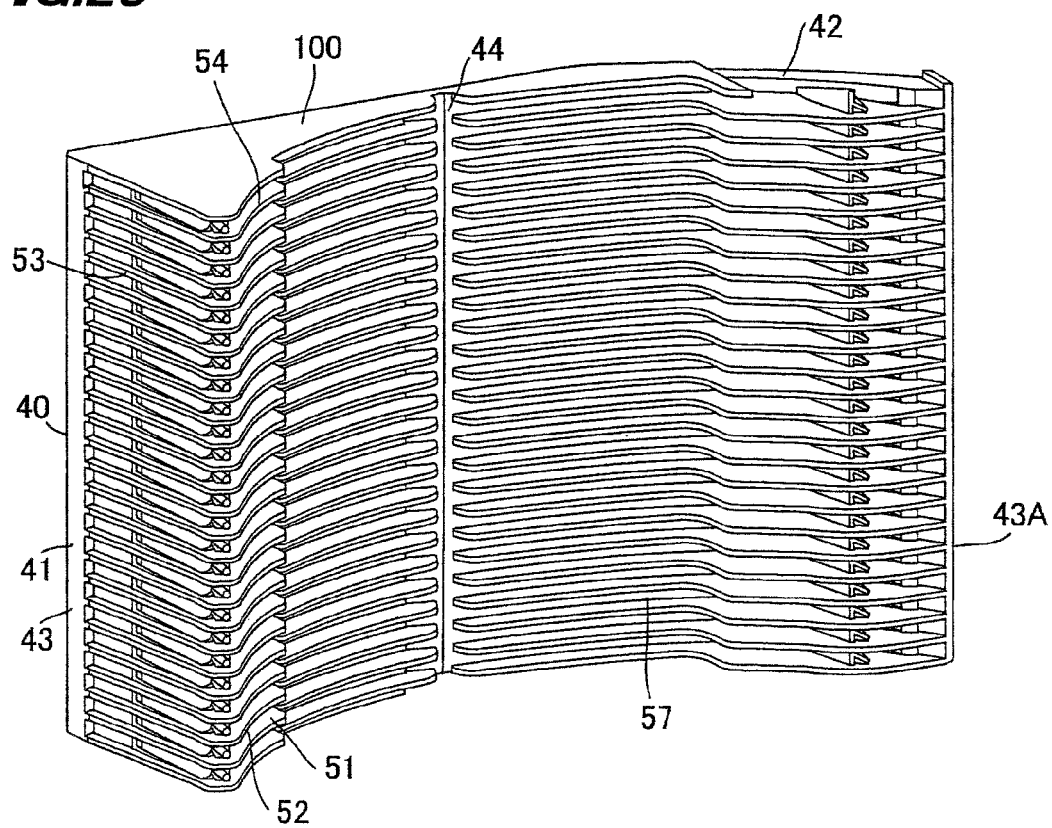
FIG. 28 is a perspective illustrative view schematically showing a supporting body in a second embodiment of a substrate storage container.
Figure 29:
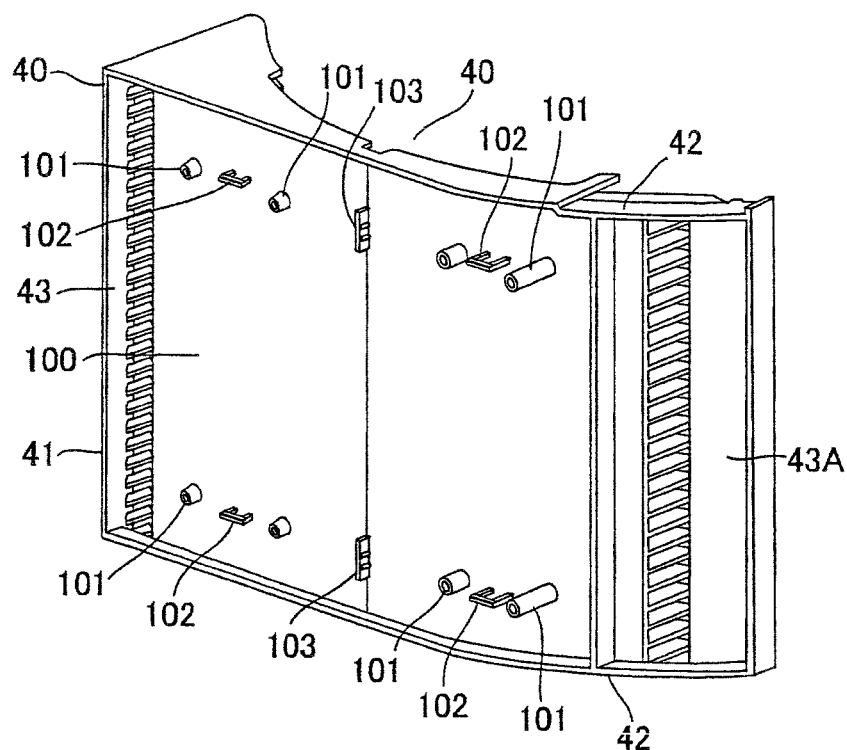
FIG. 29 is a perspective illustrative view schematically showing the backside of a supporting body in a second embodiment of a substrate storage container.
Figure 30:
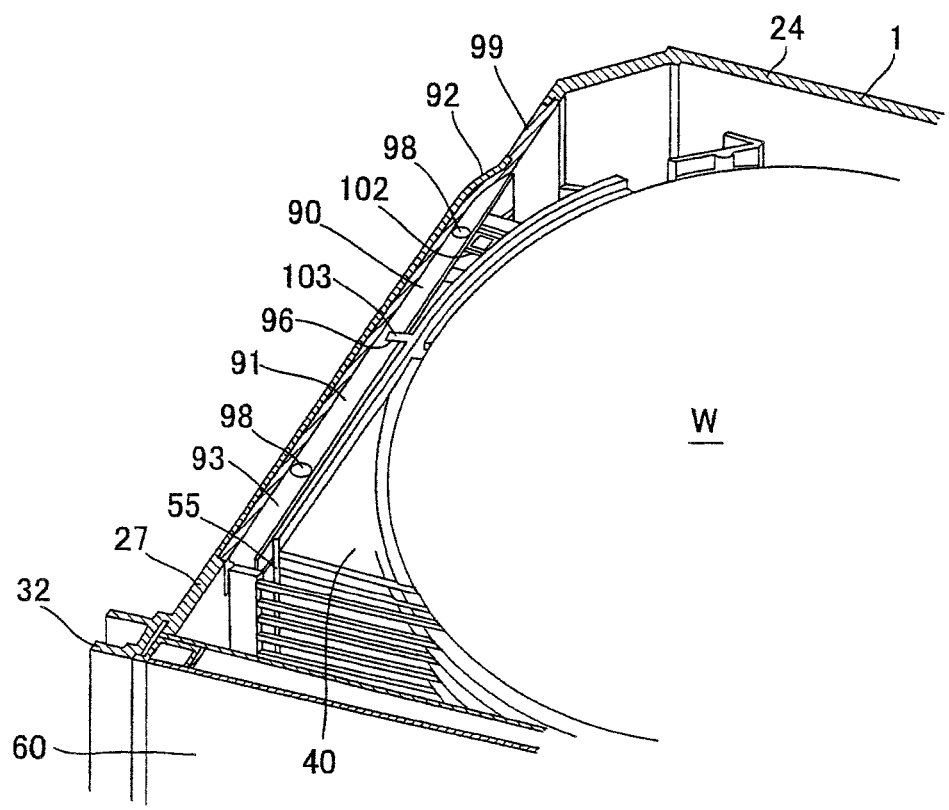
FIG. 30 is a partly cutout perspective illustrative view schematically showing a supported state of semiconductor wafers by a supporting structure in a second embodiment of a substrate storage container.
Figure 31:
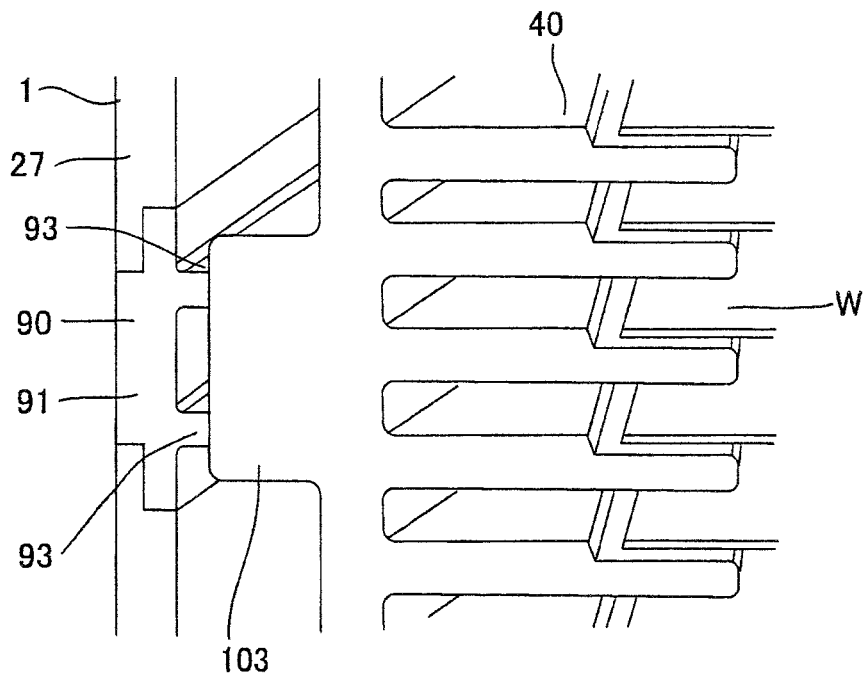
FIG. 31 is a perspective illustrative view schematically showing the relationship between a container body and positioning ribs in a second embodiment of a substrate storage container.
Figure 32:
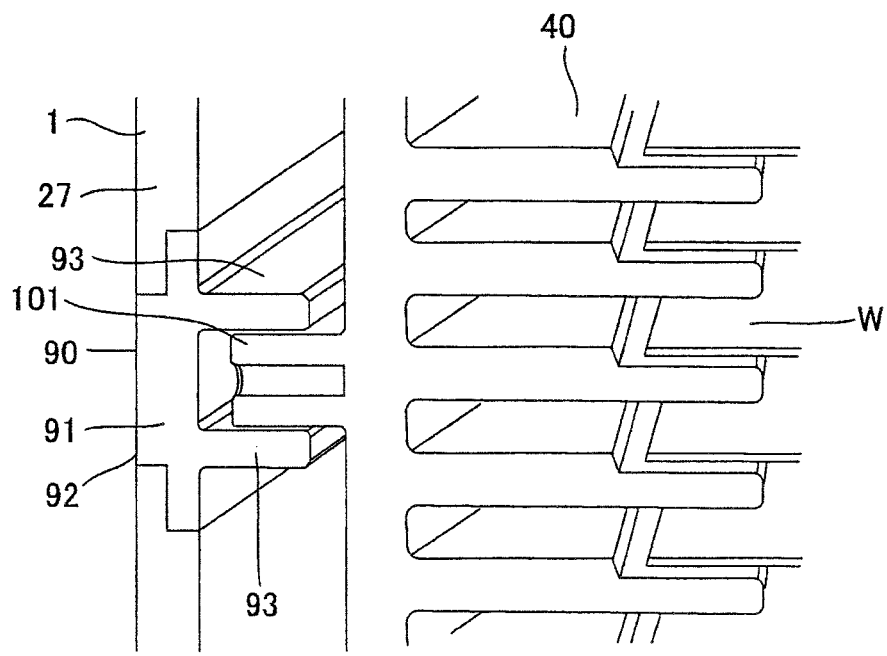
FIG. 32 is a perspective illustrative view schematically showing the relationship between a container body and a positioning boss in a second embodiment of a substrate storage container.
Figure 33:
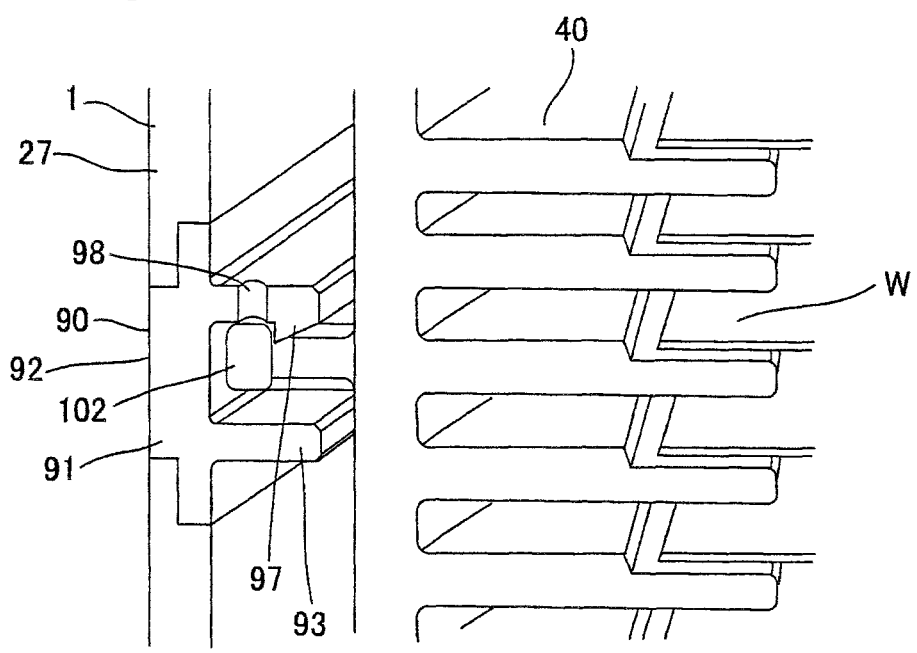
FIG. 33 is a perspective illustrative view schematically showing the relationship between an engagement claw and an engagement hook of a container body in a second embodiment of a substrate storage container.

Locking mechanism 80 includes: a pair of rotary plates 81 that are disposed left and right and rotationally operated by operational pins of a door opening and closing system that pass through operational openings 77 of front plate 76; a plurality of slide plates 84 that slide upwards and downwards as each rotary plate 81 rotates; and a plurality of engagement claws 87 that are projected from casing 61 and engaged into engagement holes 35 of rim flange 32 as each slide plate 84 slides, and is positioned in front of front retainer 69 (see FIG. 23).

Each rotary plate 81 is given basically in a disk form having an approximately rectangular projected section, has a pair of approximately semicircular engagement slots 82 that are cut out apart from each other near the peripheral edge. The rotary plates are axially supported at the left and right sides of the front of casing 61 and positioned in the vicinity of the front of front retainers 69. An operational hole 83 having an approximately oval shape when viewed from front, is formed opposing operational opening 77 of front plate 76, in the central part projected to the front side of this rotary plate 81. The operational pin of the door opening and closing system is removably inserted into this operational hole 83.

Each slide plate 84 is given in the form of a vertically long plate extended in the vertical direction of casing 61, and is supported in either left or right side on the front side of casing 61 by a plurality of guide pins 85 and positioned in the vicinity in front of front retainer 69 so that its end opposes the vicinity of the front peripheral part of rotary plate 81. The end of this slide plate 84 is formed with a projected fitting pin, on which a roller 86 that is idly fitted into engagement slot 82 of rotary plate 81 is rotatably fitted.

Each engagement claw 87 is rockably axled at around through-hole 64 of casing 61 and rockably axled at the distal end of slide plate 84 so as to be projected from and retracted into through-hole 64 as slide plate 84 slides. This engagement claw 87 has a cylindrical roller 88 rotatably axled so that this roller 88 is projected from through-hole 64, slid into and engaged with engagement hole 35.

In this locking mechanism 80, when each rotary plate 81 is rotated in the locking direction, e.g., clockwise, by the operational pin of the door opening and closing system, each slide plate 84 linearly and vertically slides outwards of door 60 so that each engagement claw 87 projects out of through-hole 64 of casing 61 and its roller 88 enters into engagement hole 35 of rim flange 32 to thereby firmly lock door 60 that has been fitted inside rim flange 32 of container body 1.

In contrast, when each rotary plate 81 is rotated in the unlocking direction, e.g., counter-clockwise, by the operational pin, each slide plate 84 that has been projected, linearly and vertically slides back into door 60 so that roller 88 of each engagement claw 87 retracts and returns from the interior of engagement hole 35 of rim flange 32 into through-hole 64 of casing 61, whereby door 60 can be taken out from rim flange 32 of container body 1.

In the above configuration, when semiconductor wafer W is set on a pair of supporting bodies 40 in container body 1, semiconductor wafer W is horizontally inserted into and between paired supporting bodies 40 of container body 1 by means of a dedicated robot. Then, the semiconductor wafer W is moved down and set on supporting ribs 56 of front supporting piece 52 and rear supporting piece 57 of each supporting body 40 so as to support the underside of semiconductor wafer W at two points, whereby it is possible to support semiconductor wafer W horizontally on a pair of supporting bodies 40 of container body 1. At this time, the front supporting piece 52 and rear supporting piece 57 of each supporting member 51 support the underside of semiconductor wafer W at not only the vicinity of the maximum diameter of the peripheral edge of semiconductor wafer W but in greater areas on both sides thereof than the conventional configuration does.

According to the above configuration, since supporting piece 51 of frame 41 is formed long and projected inwards of container body 1 so that the supporting area that supports large-diametric semiconductor wafer W is made wider than the conventional configuration, it is possible to inhibit increase in the amount of sagging of thin heavy semiconductor wafer W. Accordingly, it is possible to markedly effectively eliminate the fear of thin semiconductor wafers W or large-diametric semiconductor wafers W being vibrated, neighboring large-diametric semiconductor wafers W being brought into contact with each other or damaged from resonance when the substrate storage container is transported.

Further, since supporting body 40 of a greater size than the conventional size is molded separately from container body 1, it is possible to easily mold supporting body 40 using molding material excellent in smoothability as well as to markedly improve dimensional accuracy, whereby thin semiconductor wafer W or large-diametric semiconductor wafer W can be put in and taken out quickly and safely when the wafer is put in or taken out by a dedicated robot. Further, since long supporting member 51 is not formed of a single flat plate but is divided into front supporting piece 52 and rear supporting piece 57, it is possible to prevent deformation of supporting member 51 accompanied by molding.

Further, since a hollow 55 is formed without filling molding material between frame 41 and front supporting piece 52, it is possible to inhibit or prevent generation of sink marks and deformation on the surface of front supporting piece 52 during molding and improve dimensional accuracy even if, for example the proximal part of front supporting piece 52 that is projected from frame 41, is formed thick while projected part 53 and curved part 54 of front supporting piece 52 are made long.

Further, since, instead of screw-fitting top flange 19 in the easily-flexed central part of top plate 16, screw bosses 4B, positioning bosses 12B, screw holes 21 and fastening screws are disposed in the interface between top plate 16 and each side wall 27 that is unlikely to deform, there is no risk of top plate 16 being arched due to weight, hence container body 1 being deformed.

Due to this prevention against deformation of container body 1, it is possible to safely retain semiconductor wafers W in place in supporting bodies 40 and hence prevent damages etc., due to excessive stress accompanied by deformation of container body 1, acting on semiconductor wafers W or conversely due to vibration of semiconductor wafers W caused by insufficiency of the supporting strength of front retainer 69 accompanied by deformation of container body 1. Further, since prevention against deformation of container body 1 contributes to maintaining sealability of open front 31 of container body 1, it is possible to expect prevention against contamination of semiconductor wafers W.

Next, FIGS. 25 to 33 show the second embodiment of the present invention. In this case, a separate supporting structure 90 is integrally formed with either side wall 27 of container body 1 so that supporting bodies 40 are removably attached to the multiple supporting structures 90.

Supporting structure 90 includes: a pair of top and bottom supporting rails 91 that extend in the front-to-rear direction of container body 1 and arranged apart from and opposing each other; and a joint plate 99 for joining between the rear ends of the paired top and bottom supporting rails 91, these paired supporting rails 91 and joint plate 99 have been previously integrally molded using a predetermined molding material before molding container body 1. The supporting structures are inserted into the mold for molding container body 1 to partially form side walls 27 of container body 1.

Each supporting rail 91 includes a flat plate 92 that is horizontally extended in the front-to-rear direction and partially forms side wall 27 of container body 1. A pair of top and bottom parallel ribs 93 are arranged on, and in the longitudinal direction of, the interior surface of this flat plate 92 inside container body 1 and horizontally provided apart from each other. A joint rib 95 that defines a draining gap 94 between itself and the inner surface of flat plate 92 is vertically joined between the front ends of the paired parallel ribs 93. A cutout 96 having an approximately U-shape, when viewed from top, for positioning supporting body 40 with respect to the front-to-rear direction is formed in the middle of each of paired parallel ribs 93.

Flat plate 92 is given in a long and narrow form, and its rear end joined to joint plate 99 partially forms the rear part of side wall 27 of container body 1 or is inwardly curved correspondingly when the rear part of side wall 27 is inclined. Further, of the paired parallel ribs 93, the parallel rib 93 located above is integrally formed on its underside in the front and rear, with engagement claws 97 having an approximately triangular section. The parallel rib 93 located above has operational through-holes 98 formed in the front and rear to release the engagement of engagement claws 97 with supporting body 40.

Joint plate 99 is given as a vertical plate extending in the vertical direction of container body 1 and is selectively made transparent so as to provide visibility. The top and bottom ends are bent inwards of container body 1, forming a rear part of the side wall 27 or a rear part of side wall 27 that functions as inspection window 25 when container body 1 is molded.

As the molding material of supporting structure 90, the molding material excellent in compatibility with the molding material of container body 1, the molding material similar to that of container body 1, conductive material and the like, for example, transparent polycarbonate etc., can be listed though not particularly limited. Since use of transparent polycarbonate to mold supporting structure 90 makes it possible to use joint plate 99 as inspection window 25, it is possible to visually observe and grasp the interior of container body 1 and semiconductor wafers W from the outside, take advantage for mapping, or easily adjust the loading position and unloading position of semiconductor wafers W by a robot.

Supporting body 40 is basically the same as the above embodiment, but at least attachment pins 46, positioning attachment pieces 47, height adjustment pins 48, attachment groove 49 and the like are omitted and the configuration of expanded attachment piece 50 is modified, taking the use of supporting structure 90 into consideration. With this supporting body 40, of the backside and pair of top and bottom crossrails 42 of frame 41 that oppose the inner surface of side wall 27 of container body 1, at least the backside is covered by a covering plate 100. A pair of cylindrical positioning bosses 101 that snugly fit, being held between a pair of parallel ribs 93 of supporting rail 91, are arranged at the front and rear in upper and lower positions of this covering plate 100. Fitting of these multiple positioning bosses 101 positions the supporting body with respect to the vertical direction.

Between each of the pairs of positioning bosses 101 arranged in the front and rear in the upper and lower sides, an engagement hook 102 that engages engagement claw 97 of parallel rib 93 is projectively formed. Engagement of this engagement hook 102 attaches supporting body 40 to supporting structure 90 and position the supporting body without any backlash in the left-and-right direction. Each engagement hook 102 is given in an approximately U-shaped form, for example, when viewed from top. When engaged with engagement claw 97 of parallel rib 93, the hook is located directly below operational through-hole 98. When disengaged from engagement claw 97 of parallel rib 93, the hook is deflected downward and separated from engagement claw 97 by a pressing operation of an unillustrated releasing pin that is penetrated through operational through-hole 98.

Positioning ribs 103 for fitting into cutouts 96 of parallel ribs 93 are arranged at the upper and lower center of cover plate 100. Fitting of these multiple positioning ribs 103 positions supporting body 40 with respect to the front-to-rear direction. Each positioning rib 103 is given in a small bar-like form extending vertically with its top and bottom each curved in an arc shape. Other components are the same as in the above embodiment so that description is omitted.

Also in the above embodiment, the same operation and effect as those of the above embodiment can be expected. Further, since side wall 27 of container body 1 is formed by a complex separate supporting structure 90, it is possible to simplify the structure of the mold for container body 1. Accordingly, fitting rail 28 and key-equipped stopper 29 of container body 1 can be omitted, hence it is obvious that the design flexibility of container body 1 can be markedly improved and manufacturing cost can be sharply cut down. Further, since a pair of supporting rails 91 and joint plate 99 of supporting structure 90 are not given as separate parts but are given as an integrated single part, it is possible to easily insert supporting structure 90 into the mold when container body 1 is molded.

Though the container body 1 and top flange 19 in the above embodiment may be molded of molding material including resin, metals such as aluminum, SUS, titanium alloys, etc., may be used for forming. Further, the number of key-equipped stoppers 29 of side wall 27 of container body 1 is not particularly limited, single or plural, and the stoppers may be formed at other positions than the side opposite to grip 30. For example, key-equipped stopper 29 may be formed on the inner surface of inspection window 25 that is inserted in side wall 27. Further, handles for holding operation may be formed on the external surface of side walls 27, as necessary.

An attachment portion for attachment of barcodes and RF tags for an RFID system may be formed in bottom plate 13, for example, at the rear end thereof. While, a pair of framing ribs 36 in the front and rear are formed and arranged apart from each other on, at least, the top and left and right sides of the external surface of rim flange 32 and a plurality of X-ribs 37 that ensure strength between these is provided, a reinforcing rib 38 that is integrated with plural X-ribs 37 may be formed between paired framing ribs 36. In this case, it is possible to appropriately use plate ribs etc., instead of X-ribs 37.

Positioning attachment piece 47 of frame 41 may be formed of a plurality of projections having different heights. Further, plural height adjustment pins 48 may be formed of a slope-equipped rib or the like. Roller 88 of locking mechanism 80 may be given as a polygonal prism instead of as cylindrical form so that its flat facet may be engaged inside engagement hole 35 to assure locking stability and reliability of door 60.

Though container body 1 is molded with separate supporting structures 90 inserted in both the side walls thereof, the supporting structures may be integrated using a ultrasonic welding process or a heat welding process. It is also possible to removably attach separate supporting structures 90 to the side walls 27 of container body 1 using sealing material and/or fastening parts. Further, supporting structure 90 may be given as multiple supporting rails 91 that are spaced opposing one another and extended in the front-to-rear direction of container body 1 with joint plate 99 omitted. The number of paired supporting rails 91 may be increased as appropriate; three, four or more rails may be given. Further, engagement claw 97 may be bent in an approximately J-shape, approximately L-shape or the like. Also covering plate 100 may be formed so as to cover the backside of frame 41 of supporting structure 40 and paired top and bottom crossrails 42.

While description has been made in connection with exemplary embodiments of the present invention, it will be obvious to those skilled in the art that various changes and modifications may be made therein without departing from the present invention. It is aimed, therefore, to cover in the appended claims all such changes and modifications falling within the true spirit and scope of the present invention.

DESCRIPTION OF REFERENCE NUMERALS

1 container body
2 base plate
3 left and right attachment grooves
16 top plate
24 rear wall
26 fall stopper (falling stopper)
27 side wall
28 fitting rail
29 key-equipped stopper
31 front
32 rim flange
40 supporting body
41 frame
42 crossrail
43 stile
43A stile
44 sectioning joint piece
45 reinforcing joint piece
46 attachment pin (left-and-right direction positioning attachment portion)
47 positioning attachment piece (vertical direction positioning attachment portion)
48 height adjustment pin (height adjustor)
49 attachment groove
50 expanded attachment piece
51 supporting member
52 front supporting piece
53 projected part
54 curved part
55 hollow
56 supporting rib
57 rear supporting piece
90 supporting structure
91 supporting rail
92 flat plate
93 parallel rib
96 cutout
97 engagement claw
98 operational through-hole
99 joint plate
100 covering plate
101 positioning boss
102 engagement hook
103 positioning rib
W semiconductor wafer (wafer)

The invention claimed is:
1. A substrate storage container comprising:
a container body configured to be formed of a front open box and accommodate wafers having a diameter of 300 nm or greater; and
a door configured to open and close an open front of the container body, and
the container body including supporting bodies that can support wafers on both interior side walls thereof, and
the door comprising:
a casing configured to be engaged with the open front of the container body;
a front plate configured to cover an open front of the door; and a locking mechanism configured to be interposed between the casing and the front plate, and the supporting body respectively comprising:

a frame configured to oppose a direction of an internal side of the container body; and supporting members configured to be projected from the frame and support the wafers, and the supporting members being respectively formed of:

a front supporting piece that is projected from the frame and approximately horizontally retains the wafer on, at least, a side part of a front peripheral edge; and a rear supporting piece that is projected from the frame and approximately horizontally retains the wafer on, at least, a side part of a rear peripheral edge; and wherein the front supporting piece is formed of: a projected part that extends from the front of the frame toward the front peripheral edge of the wafer; and a curved part extends rearwards from the projected part along the peripheral edge of the wafer, and wherein the frame of the supporting body includes a pair of top and bottom crossrails arranged apart from and opposing to each other, and a pair of stiles arranged vertical at the front and rear between the pair of crossrails, and wherein a left-and-right direction positioning attachment portion for positioning with respect to the left and right direction and a vertical direction positioning attachment portion for positioning with respect to the vertical direction are respectively provided on the pair of top and bottom crossrails, and wherein front retainers configured to hold the side part of the front peripheral edge of the wafer are attached to a back surface of the casing of the door, and wherein the locking mechanism of the door is made up of: rotary plates configured to be rotatably supported on the casing of the door; side plates configured to slide upwards and downwards in accordance with rotation of each rotary plate; and engagement claws configured to be projected from the casing in accordance with a slide of each slide plate, and wherein the locking mechanism is disposed in front of the front retainers, and wherein the frame of the supporting body, the front supporting piece, and the rear supporting piece are integrally molded with a hollow formed between the frame and the front supporting piece.

2. The substrate storage container according to claim 1, wherein the frame of the supporting body includes a height adjustor for adjusting the height.

3. The substrate storage container according to claim 1, wherein the frame of the supporting body is given in an approximately laterally long form having a sectioning joint piece between the opposing top and bottom parts, and wherein the rear of the curved part of the front supporting piece and the front end of the rear supporting piece are joined to the sectioning joint piece.

4. The substrate storage container according to claim 1, wherein a reinforcing joint piece for supporting the rear supporting piece is provided between the top and bottom parts of the frame of the supporting body.

5. The substrate storage container according to claim 1, wherein the container body is formed of a front open box with a front opening, wherein a pair of supporting structures for supporting bodies are provided on both the interior side walls of the container body, and wherein the supporting structure comprises:

a pair of top and bottom supporting rails that abut the vertical direction positioning attachment portion of the supporting body to position the supporting body with respect to the height direction; and an attachment portion for positioning the supporting body with respect to the left-and-right direction.

6. The substrate storage container according to claim 5, wherein separate supporting structures are attached afterwards to both the interior side walls of the container body.

7. The substrate storage container according to claim 5, wherein the supporting structures are integrally formed on both the interior side walls of the container body.

8. The substrate storage container according to claim 5, wherein the supporting rail of the supporting structure is formed with a cutout that fits with the positioning rib formed on the supporting body and an engagement claw that engages an engagement hook formed in the supporting body.

9. The substrate storage container according to claim 1, wherein at least one falling stopper for the supporting body is formed inside the container body.

10. A substrate storage container comprising:

a container body configured to be formed of a front open box and accommodate wafers having a diameter of 300 mm or greater; and a door configured to open and close an open front of the container body, and the container body including supporting bodies that can support wafers on both interior side walls thereof, and the door comprising:

a casing configured to be engaged with the open front of the container body;

a front plate configured to cover an open front of the door; and a locking mechanism configured to be interposed between the casing and the front plate, and the supporting body respectively comprising:

a frame configured to oppose a direction of an internal side of the container body; and supporting members configured to be projected from the frame and support the wafers, and wherein the frame of the supporting body includes a pair of top and bottom crossrails arranged apart from and opposing to each other, and a pair of stiles arranged vertical at the front and rear between the pair of crossrails, the supporting members being respectively include:

a front-side supporting rib that is projected from the frame and approximately horizontally retains the wafer on, at least, a side part of a front peripheral edge; and a rear-side supporting rib that is projected from the frame and approximately horizontally retains the wafer on, at least, a side part of a rear peripheral edge, and wherein the front-side supporting rib and the rear-side supporting rib are integrally formed, and wherein the front-side supporting rib is formed of: a projected part that extends from the front of frame toward the front peripheral edge of the wafer; and a curved part that extends rearwards from the projected part along the peripheral edge of the wafer, and wherein front retainers configured to hold the side part of the front peripheral edge of the wafer are attached to a back surface of the casing of the door, and wherein the locking mechanism of the door is made up of: rotary plates configured to be rotatably supported on the casing of the door; slide plates configured to slide upwards and downwards in accordance with rotation of each rotary plate; and engagement claws configured to be projected from the casing in accordance with a slide of each slide plate, and
wherein the locking mechanism is disposed in front of the front retainers.

* * * * *